US006373250B1

(12) United States Patent
Tsoref et al.

(10) Patent No.: US 6,373,250 B1
(45) Date of Patent: Apr. 16, 2002

(54) METHOD OF MAGNETIC RESONANCE IMAGING

(75) Inventors: Liat Tsoref, Tel Aviv; Uzi Eliav; Gil Navon, both of Ramat Gan, all of (IL)

(73) Assignee: Ramot University Authority For Applied Research and Industrial Development Ltd., Tel-Aviv (IL)

( * ) Notice: Subject to any disclaimer, the term of this patent is extended or adjusted under 35 U.S.C. 154(b) by 0 days.

(21) Appl. No.: 09/574,241

(22) Filed: May 19, 2000

(51) Int. Cl.$^7$ ................................................. G01V 3/00
(52) U.S. Cl. ........................................ 324/309; 324/307
(58) Field of Search ................................ 324/307, 309, 324/312, 314, 300, 306

(56) References Cited

U.S. PATENT DOCUMENTS 5,317,264 A * 5/1994 Rommel et al. ............ 324/309
5,818,230 A * 10/1998 Katz et al. .................. 324/309

OTHER PUBLICATIONS

Seo et al, "H Double–Quantum–Filtered MR Imaging as a New Tool for Assessment of Healing of the Ruptured Achilles Tendon", *Magnetic Resonance in Medicine*, 42:884–889, 1999.

* cited by examiner

*Primary Examiner*—Louis Arana

(57) ABSTRACT

A method of slice selective multiple quantum magnetic resonance imaging of an object is disclosed. The method is effected by implementing the steps of (a) applying a radiofrequency pulse sequence selected so as to select a coherence of an order n to the object, wherein n is zero, a positive or a negative integer other than ±1; (b) applying magnetic gradient pulses, so as to select a slice of the object to be imaged arid to create an image; and (c) acquiring a radiofrequency signal resulting from the object, so as to generate a magnetic resonance slice image of the object. The method provides slice selective multiple quantum magnetic resonance images of yet unprecedented quality in terms of contrast. The method is particularly useful for imaging connective tissues.

20 Claims, 13 Drawing Sheets

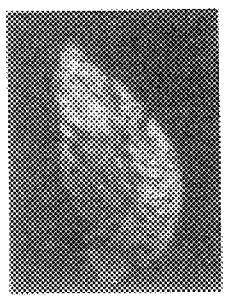 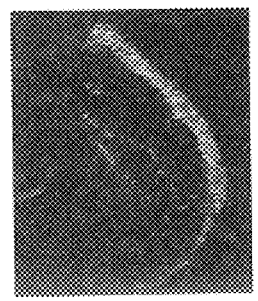 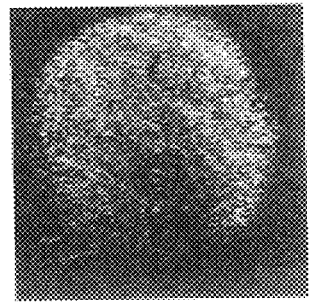
Fig. 12a     Fig. 12b     Fig. 12c
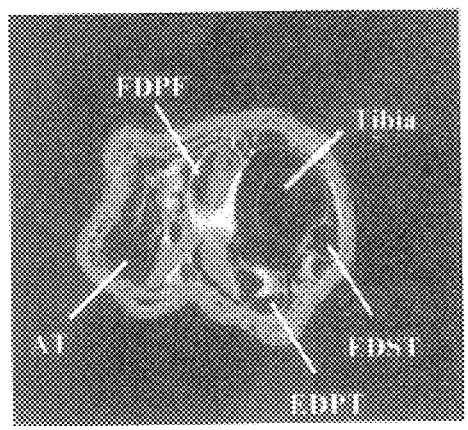 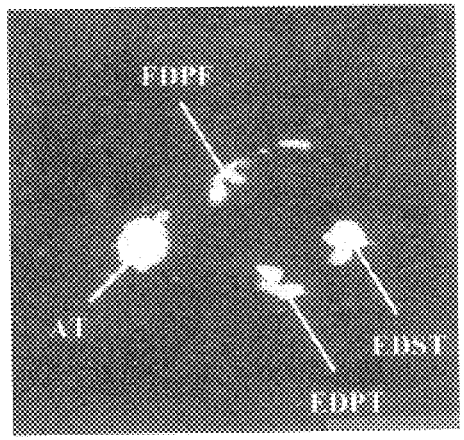
Fig. 13a     Fig. 13b

METHOD OF MAGNETIC RESONANCE IMAGING

FIELD AND BACKGROUND OF THE INVENTION

The present invention relates to magnetic resonance imaging and, more particularly, to a method of slice selective multiple quantum magnetic resonance imaging of, for example, connective tissues.

Connective tissues, such as ligaments, tendons and cartilage appear in standard magnetic resonance (MR) images with low signal-to-noise (S/N) ratio (SNR) due to the water short $T_2$ relaxation times. Images performed with short echo time (TE), result in a significant loss of contrast. In addition to the need to enhance the nuclear magnetic resonance (NMR) signal of connective tissues, it is also important to increase the contrast between the different compartments within a specific tissue and between adjacent tissues.

Methods developed to meet these requirements include heavily T, weighted imaging [R. J. Scheck, A. Romagnolo, R. Biemer, T. Pfluger, K. Wilhelm, K. HEran, The carpal ligaments in MR arthrograpby of the wrist: correlation with standard MRI and wrist arthroscopy, J. Magn. Reson. Imag. 1999; 9:468–474] magnetization transfer [T. D. Scholz, R. F. Eyot, J. R. DeLeornardis, T. L. Ceckler, R. S. Balaban, Water-macromolecular proton magnetization transfer in infarcted myocardium: a method to enhance magnetic resonance image contrast, Magn. Reson. Med 1995; 33:178–184; M. L. Gray, D. Burstein, L. M. Lesperance, L. Gehrke, Magnetization transfer in cartilage and its constituent macromolecules, Magn. Reson. Med. 1995; 34: 319–325; R. M. Henkelman, X. Huang, Q.-S. Xiang, G. J. Staniz, S. D. Swanson, M. J. Bronskill, Quantitative interpretation of magnetization transfer, Magn. Reson. Med. 1993; 29:759–766], fat suppression [C. G. Peterfy, S. Majumdar, P. Lang, C. F. van Dijke, K. Sack, H. K. Ganant, MR Imaging of the artitic knee: improved discrimination of cartilage, synovium, and effusion with pulsed saturation transfer and fat-suppressed $T_1$-weighted sequences, Radiology 1994; 191:413–419], diffusion weighted imaging [Y. Xia, T. Farquhar, N. Burton-Wurster, E. Ray, L. Jelinski, Diffusion and relaxation mapping of cartilage-bone plugs and excised disk using micromagnetic resonance imaging, Magn. Reson. Med. 1994; 31:273–282] and projection reconstruction techniques that achieve much shorter echo time than conventional methods [G. E. Gold, J. M. Pauly, A. Macovsky, R. J. Herfkens, MR spectroscopic imaging of collagen: tendons and knee menisci, Magn. Reson. Med. 1995; 34:647–6543].

While these approaches do increase the MR signal of connective tissues and the contrast between connective and adjacent tissues, the results are not yet optimal for diagnostic purposes.

It has recently been demonstrated by the inventors of the present invention that proton double quantum filtered (DQF) NIRI produces a new type of contrast and may serve as a good modality for the imaging of ordered biological tissues [Y. Sharf, Y. Seo, U. Eliav, S. Akselrod, G. Navon, Mapping strain exerted on blood vessel walls using deuterium double quantum filtered MRI, PNAS 1998; 95:4108–4112; L. Tsoref, H. Shinar, G. Navon, Observation of a $^1H$ double quantum filtered signal of water in biological tissues, Magn. Reson. Med. 1998; 39:11–17; Tsoref, H. Shinar, Y. Seo, U. Eliav, G. Navon, Proton Double Quantum Filtered MRI—A New Method for Imaging Ordered Tissues, Magn. Reson. Med. 1998; 40:720–726].

The contrast in DQF MRI stems from the fact that only water molecules associated with ordered structures are detected, and signals originating from molecules in isotropic tissues are suppressed. The $^1H$ DQF signal intensity is sensitive to the magnitude of the residual dipolar interaction and the proton exchange rate between the water molecules [U. Eliav, G. Navon, A study of dipolar interactions and dynamic processes of water molecules in tendon by $^1H$ and $^2H$ homonuclear and heteronuclear multiple-quantum-filtered NMR spectroscopy, J. Magn. Reson. 1999; 137:295–310].

Previous studies of $^1H$ and $^{23}Na$ multiple quantum imaging [Tsoref, H. 35 Shinar, Y. Seo, U. Eliav, G. Navon, Proton Double Quantum Filtered MR—A New Method for Imaging Ordered Tissues, Magn. Reson. Med. 1998; 40:720–726; M. D. Cockman, L. W. Jelinski, Double-quantum-filtered sodium imaging, J. Magn. Reson. 1990; 90:9–18] did not employ slice selection, and hence were limited to samples that are uniform along one axis.

3-D imaging techniques [R. Kemp-Harper, P. Styles, S. Wimperis, Three-dimensional triple-quantum filtration $^{23}Na$ NMR imaging, J. Magn. Reson. B. 1995; 108:280–2841] may to some extent solve this problem but are highly time consuming. Thus, for clinical applications a DQF slice selective sequence must be developed.

The short relaxation times of tendons and ligaments poses a particular problem in a straightforward application of slice-selection to the previous DQF MRI pulse sequences [Tsoref, H. Shinar, Y. Seo, U. Eliav, G. Navon, Proton Double Quantum Filtered MRI—A New Method for Imaging Ordered Tissues, Magn. Reson. Med. 1998; 40:720–726].

There is thus a widely recognized need for, and it would be highly advantageous to have, a methods of MR imaging of connective tissue devoid of the above limitations. While reducing the present invention to practice solutions to the above problems were obtained and novel protocols for multiple quantum filtered (MQF) slice selective imaging were developed. It was found that $^1H$ DQF images changed dramatically during the heating process of injured tissues and were more informative than standard MR images. It was further found that although $^1H$ DQF imaging requires high gradient slew-rates, by using composite RF-pulses one can apply $^1H$ multiple quantum techniques with a commercial clinical spectrometer. The quality of the DQF images was evaluated by comparing their SNR and the contrast to noise ratio (CNR) to standard gradient-recalled-echo (GRE) images.

SUMMARY OF THE INVENTION

According to the present invention there is provided a method of magnetic resonance imaging of an object, the method comprising the steps of (a) applying a radiofrequency pulse sequence selected so as to select a coherence of an order n to the object, wherein n is zero, a positive or a negative integer other than ±1; (b) applying magnetic gradient pulses to the object, so as to select a slice of the object to be imaged and create an image; and (c) acquiring a radiofrequency signal resulting from the object, so as to generate a magnetic resonance slice image of the object.

According to further features in preferred embodiments of the invention described below, the coherence is selected from the group consisting of double quantum filter (DQF), where n equals ±2 and triple quantum filter (TQF), where n equals ±3.

According to still further features in the described preferred embodiments the coherence is selected by phase cycling or gradient selection.

According to still further features in the described preferred embodiments the radiofrequency is selected so as to enable imaging of an atomic nucleus selected from the group consisting of $^1$H, $^2$H and $^{23}$Na.

According to still further features in the described preferred embodiments the radiofrequency pulse sequence is selected so as to optimize imaging of the atomic nucleus.

According to still further features in the described preferred embodiments the radiofrequency signal is derived from an atomic nucleus selected from the group consisting of $^1$H, $^2$H and $^{23}$Na.

According to still further features in the described preferred embodiments a creation time of the radiofrequency pulse sequence is selected so as to maximize the radiofrequency signal or to obtain a desired contrast.

According to still further features in the described preferred embodiments a time to echo as controlled by the magnetic gradient pulses is selected so as to maximize the radiofrequency signal or to obtain a desired contrast.

According to still further features in the described preferred embodiments a repetition time of the radiofrequency pulse sequence is selected sufficiently long so as to minimize single quantum leakage.

According to still further features in the described preferred embodiments the method further comprising the step of (d) applying a crusher pulse prior to step (a) so as to permit shortening of the repetition time.

According to still further features in the described preferred embodiments the crusher pulse is selected from the group consisting of a magnetic gradient pulse, a radiofrequency pulse and a combination thereof.

According to still further features in the described preferred embodiments the crusher pulse includes a first 90° radiofrequency pulse, followed by a gradient pulse and a second 90° radiofrequency pulse.

According to still father features in the described preferred embodiments a slice refocusing gradient is employed during a time interval selected from the group consisting of a creation time, an evolution time and a time to echo.

According to still filter features in the described preferred embodiments a read gradient is employed during a time interval selected from the group consisting of a creation time, an evolution time and a time to echo.

According to still further features in the described preferred embodiments a phase gradient is employed during a time interval selected from the group consisting of a creation time, an evolution time and a time to echo.

According to still further features in the described preferred embodiments the object is a tissue.

According to still further features in the described preferred embodiments the tissue is a connective tissue.

According to still further features in the described preferred embodiments the tissue is selected from the group consisting of a tendon, a portion of a skin, a bone, a muscle, a cartilage, a blood vessel, a ligament, an organ or a portion thereof, a nerve, a lymph node.

According to still further features in the described preferred embodiments the organ is selected from the group consisting of a brain, a heart, a kidney, a gland, a testicle, an ovary, an eye, a liver, a pancreas and a spleen.

The present invention successfully addresses the shortcomings of the presently known configurations by providing a novel method of slice selective multiple quantum magnetic resonance imaging of connective and other tissues, such as ligaments, tendons and cartilage which appear in standard magnetic resonance images with low signal-to-noise ratio and/or a significant loss of contrast. The novel method, as is further described exemplified hereinbelow overcome the limitations of the standard, prior art, methods.

BRIEF DESCRIPTION OF THE DRAWINGS

The invention is herein described, by way of example only, with reference to the accompanying drawings. The file of this patent contains at least one drawing executed in color. Copies of this patent with color drawing(s) will be provided by the Patent and Trademark Office upon request and payment of the necessary fee. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

IN THE DRAWINGS

Figure 1A:
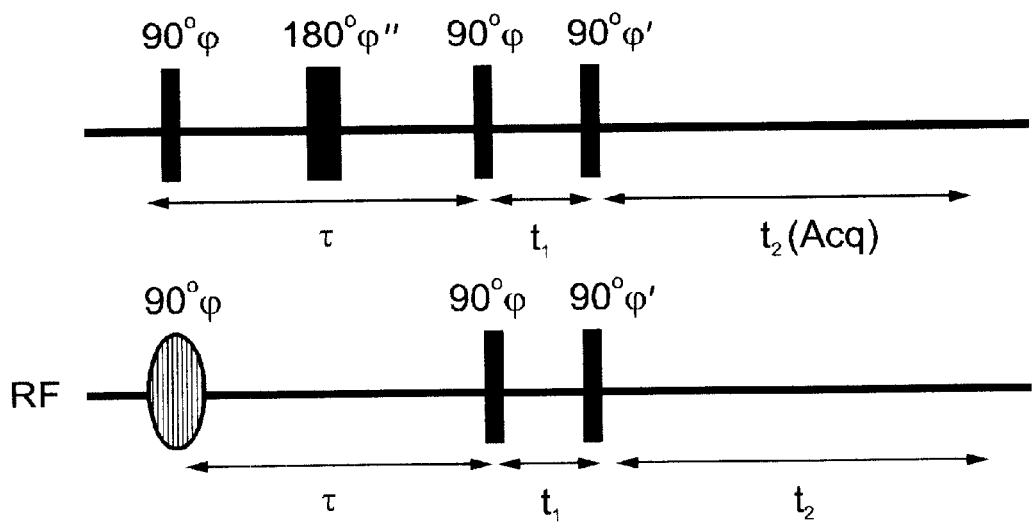
Figure 1B:
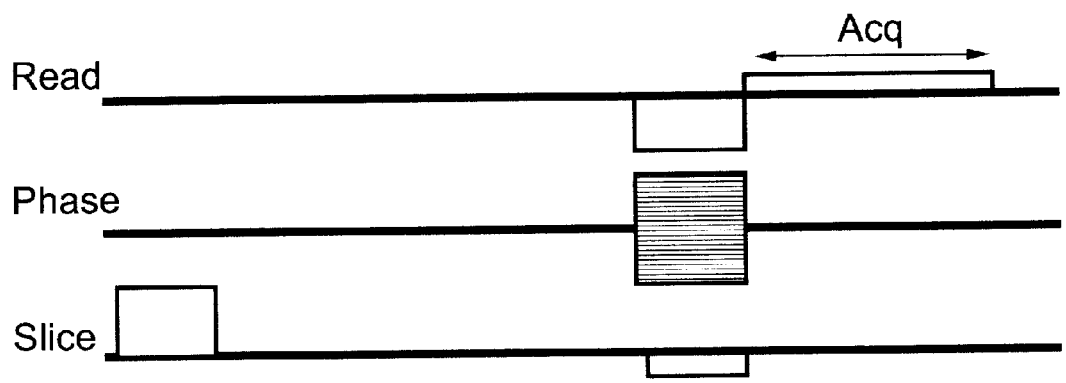

FIGS. 1$a$–$b$ demonstrates pulse sequences of $^1$H DQF NMR spectroscopy (FIG. 1$a$) and imaging (FIG. 1$b$). Typical parameters used for the DQF image are as follows: field of view (FOV) 2.56×2.56 cm, slice thickness 2 mm, data matrix 128×128, duration of Gaussian excitation pulse 300 $\mu$s, gradient switching time 150 $\mu$s, repetition time (TR) 1.0 s, and 128 averages. The 16 step phase cycling is given by: $\phi$=0°, 180°, 90°, 270°, 90°, 270°, 180°, 0°; $\phi'$=0°, 0°, 0°, 0°, 90°, 90°, 90°, 90°, 180°, 180°, 180°, 180°, 270°, 270°, 270°, 270°; $\phi''$=0°, 90°, 180°, 270°; $\phi_{receiver}$=0°, 0°, 180°, 180°, 90°, 90°, 270°, 270°, 180°, 180°, 0°, 0°, 270°, 270°, 90°, 90°.

Figure 2:
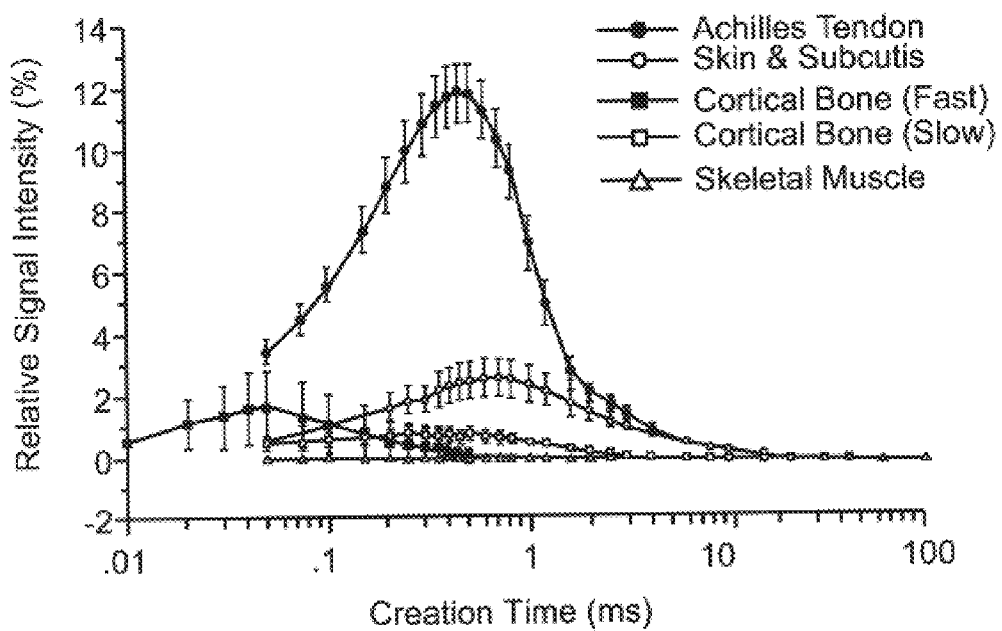

FIG. 2 is a graph demonstrating $^1$H double-quantum signal intensity as a function of the creation time, $\tau$. Intensity of the DQF signal was normalized using the intensity of the single-quantum signal. The longitudinal axis of the Achilles tendon was placed parallel to the magnetic field. AD other samples were placed to preserve their orientation relative to the magnetic field as in an intact leg. Means and standard errors are presented. The number of measurements of the Achilles tendons, skins with subcutis, cortical bones (fast decay component), cortical bones (slow decay component) and skeletal muscles are 7, 7, 6, 5 and 6, respectively.

FIGS. 3$a$–$b$ show images of an intact rabbit leg measured at 7.05 T. FIG. 3$a$—GEFI T$_2$-weighted image. Parameters used: The flip angle of sinc pulse 45°; TR 500 ms; TE 4.4 ms; FOV 2.56×2.56 cm; slice thickness 1 mm; data matrix size 256×256; and 4 averages, FIG. 3$b$-DQF images obtained at $\tau$=0.4 ms. Abbreviation used are as follows; AT: Achilles tendon, FDST: flexor digitorum superficialis tendon (plantaris tendon), FDPT: flexor digitorum profundus tendon, EDST: extensor digitorum superficialis tendon, and Subcut: subcutaneous tissue. For parameters, see FIG. 1.

Figure 4:
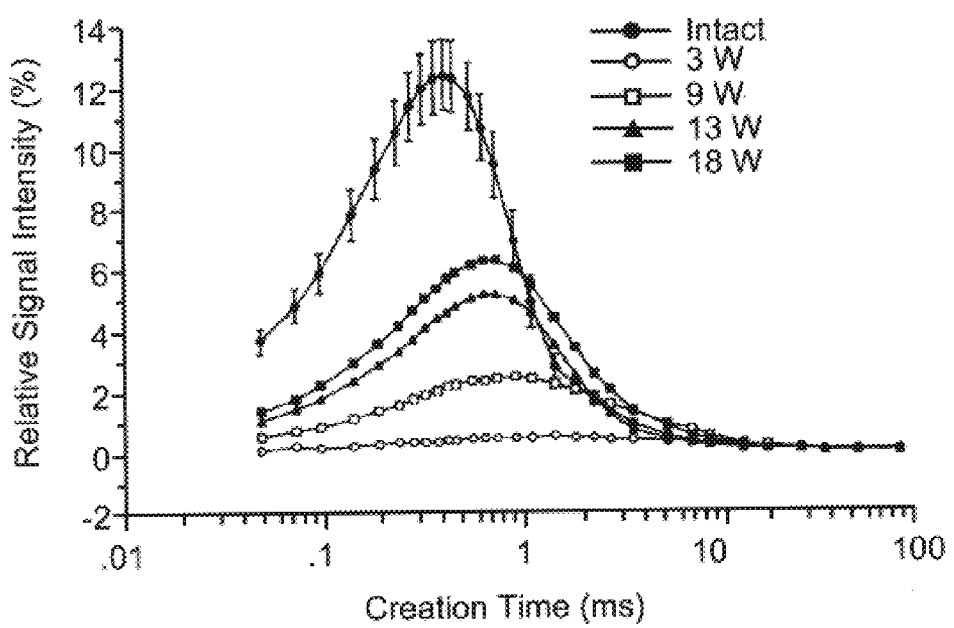

FIG. 4 is a graph demonstrating $^1$H DQF signal intensity of the intact and the regenerated parts of the Achilles tendons as a function of the creation time ($\tau$). Means and standard errors are shown for the intact tendon (n=6). Typical results of 3. 9, 13 and 18 weeks after the tenotomy are shown from 3 experiments in each. Reproducibility of measurement are similar to that of the intact tendon (ca. ±10% of the mean).

Figures 5A, 5B, 5C:
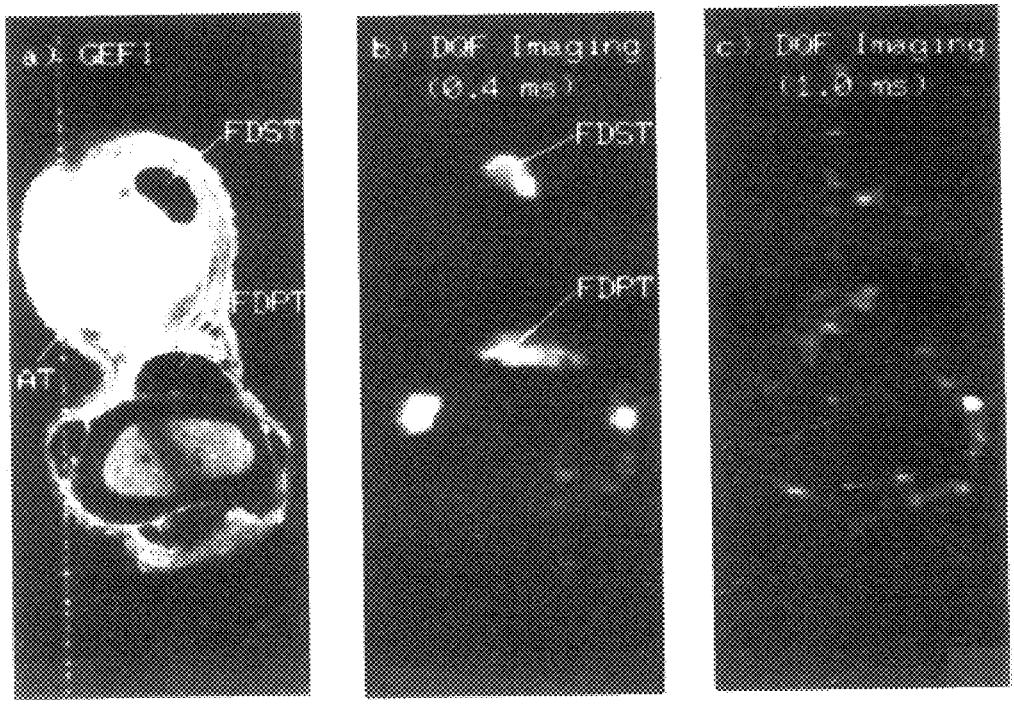

FIGS. 5 a–c show images of regenerated a rabbit leg measured 3 weeks after tenotomy. FIG. 5a—transverse GEFI T$_2$-weighted image. Parameters are the same as in FIG. 3a; FIGS. 5b–c—transverse DQF images obtained at τ=0.4 ms and 1.0 ms, respectively. For parameters, see FIG. 1.

Figure 6A:
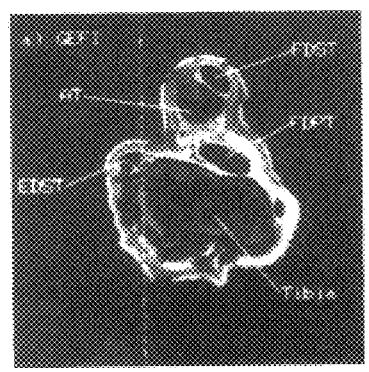
Figure 6B:
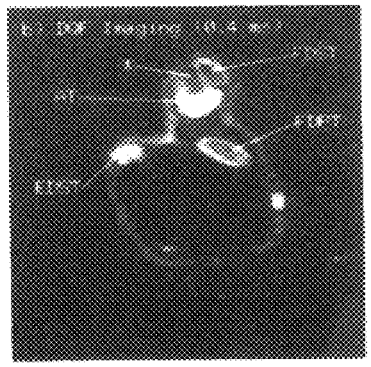
Figure 6C:
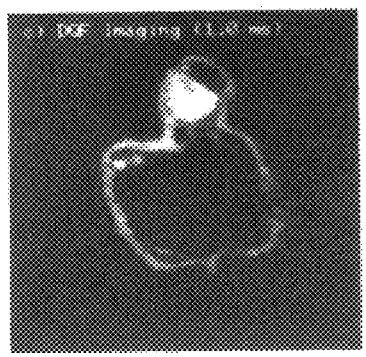
Figure 6D:
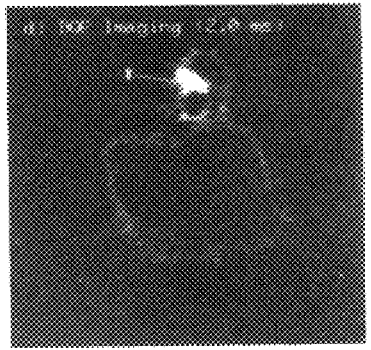

FIGS. 6a–d show images of a regenerated rabbit leg measured 18 weeks after tenotomy. FIG. 6a—transverse GEFI T$_2$-weighted image. Parameters are the same as in FIG. 3a. FIGS. 6b–d—transverse DQF images obtained at τ=0.4 ms; 1.0 ms and 2.0 ms, respectively. For parameters, see FIG. 1.

Figure 7:
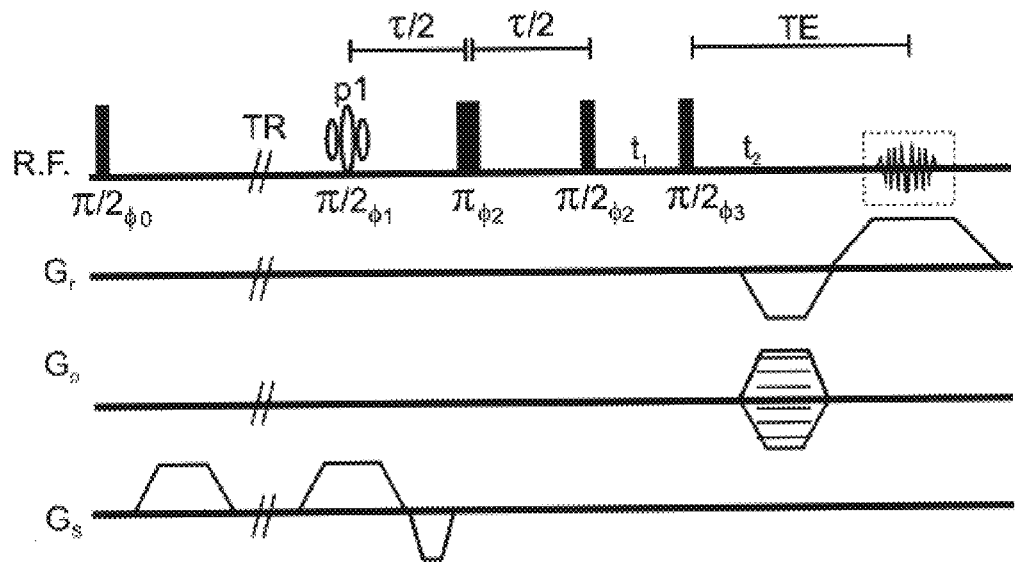

FIG. 7 demonstrates slice selective $^1$H DQF pulse sequence. PS1. The phase cycling is given by: $\phi_0=0°$; $\phi_1=0°$ 90° 180° 270° 90° 180° 270° 90° 180° 270° 0° 90° 270° 0° 90° 180°; $\phi_2=0°$ 90° 180° 270°; $\phi_3=0°$; $\phi_{receiver}=0°$ 180° 0° 180° 90° 270° 90° 270° 180° 0° 18° 0° 270° 90° 270° 90°.

Figure 8:
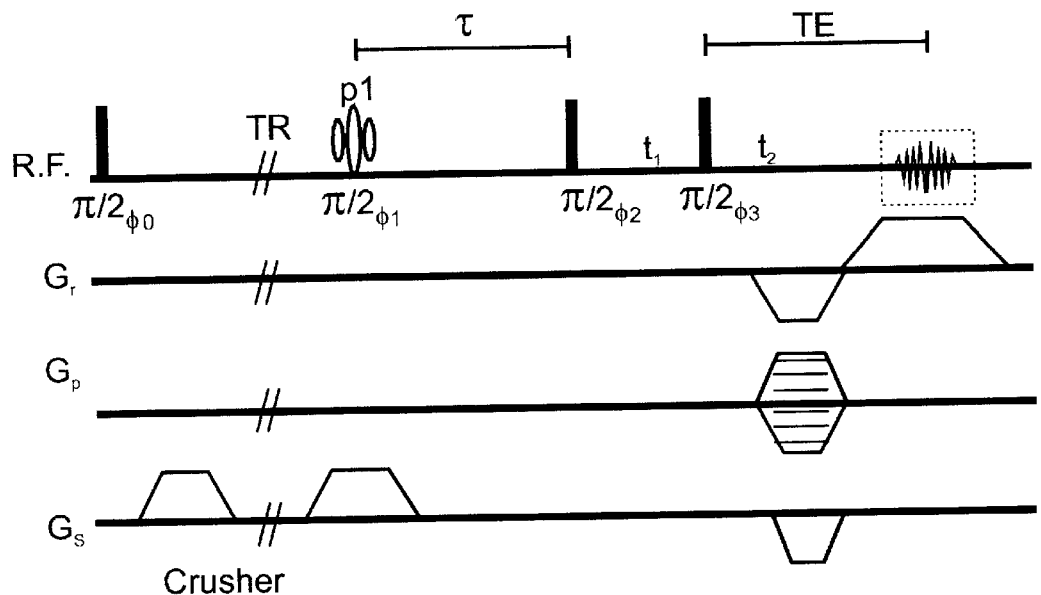

FIG.8 demonstrates slice selective $^1$H DQF pulse sequence for very short τ values, PS2. The 16 step phase cycling is given by: $\phi_0=0°$ ; $\phi_1=0°$ 90° 180° 270° 90° 180° 270° 0° 180° 270° 0° 90° 270° 0° 90° 180°; $\phi_2=0°$ 90° 180° 270°; $\phi_3=0°$; $\phi_{receiver}=0°$ 180° 0° 180° 90° 270° 90° 270° 180° 0° 180° 0° 270° 90° 270° 90°. For the 4 step phase cycling the first 4 steps for $\phi_1$ and $\phi_{receiver}$ are used.

Figure 9:
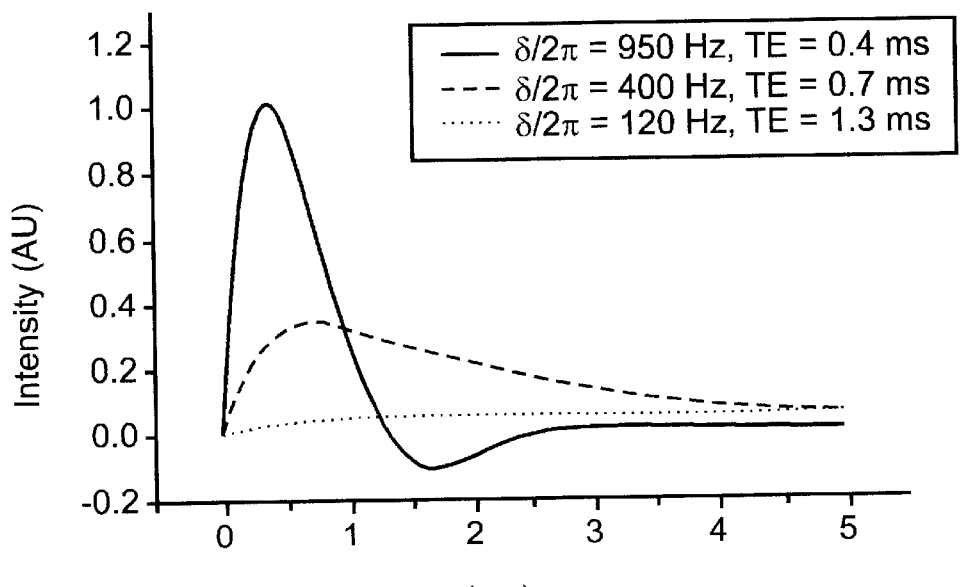

FIG. 9 is a graph demonstrating calculated intensity of the DQF signal as a function of the creation time, τ. In the simulation, the proton exchange rate was k=350 s$^{-1}$, the inhomogeneity of the magnetic field was neglected and TE was chosen to give maximum intensity for each δ value.

Figure 10A:
Figure 10A:
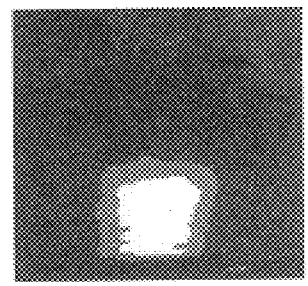
Figure 10C:
Figure 10D:
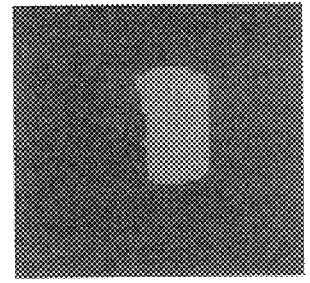

FIGS. 10a–d show gradient echo (GRE) and DQF sagital images of the phantom made of a piece of bovine ligament (top) and cartilage (bottom). FIG. 10a—GRE image obtained with a TE of 4.4 ms and TR of 200 ms. Both tissues appear similar and cannot be distinguished. FIGS. 10b–d—$^1$H DQF images obtained with τ values of 2, 1.2 and 0.2 ms respectively.

Figure 11A:
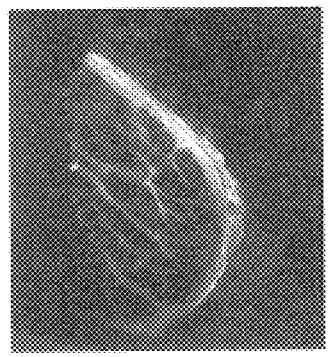
Figure 11B:
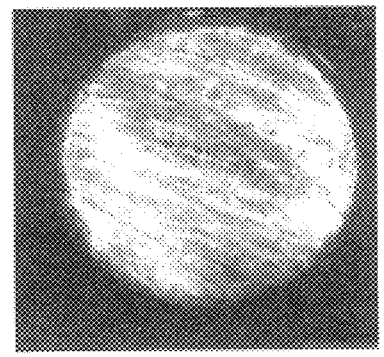

FIGS. 11a–b show gradient echo transverse images of the phantom obtained with TR of 200 ms and TE of 7 ms. FIG. 11a—a slice of the ligament. FIG. 11b—a slice of the cartilage.

FIGS. 12a–c show $^1$H DQF slice selective images of the phantom with slice width of 2 mm. The slice is set on the ligament with τ=0.4 ms (FIG. 12a) and τ=1.6 ms (FIG. 12b) where only the loose connective tissue that wraps the ligament is observed. FIG. 12c—the slice is set on the cartilage with τ1.6 ms.

FIGS. 13a–b show a slice selective GRE (FIG. 13a) and a DQF (FIG. 13b) image of a rat leg. Slice width of 2 mm, τ=0.4 ms. Abbreviations are as follow: AT-Achilles tendon, FDPF-flexor digitorum profundus tendon, EDPT-extensor digitorum profundus tendon, EDST-extensor digitorum superficialis tendon.

Figure 14A:
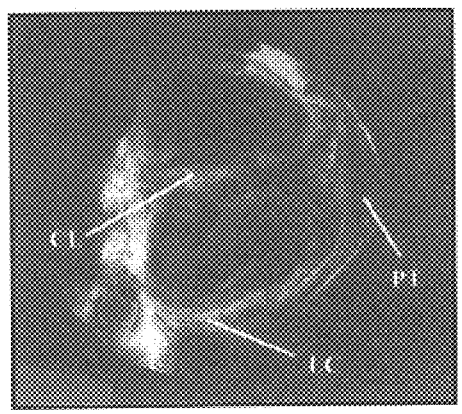
Figure 14B:
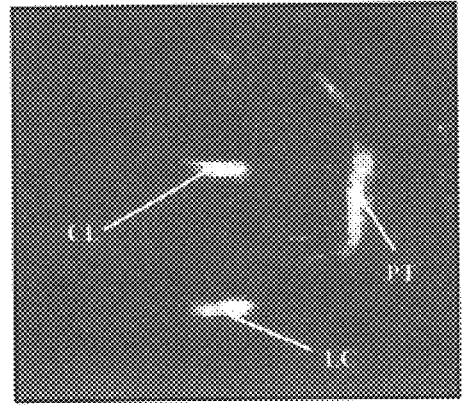

FIGS. 14a–b show a slice selective GRE (FIG. 14a) and a DQF (FIG. 14b) images of a rat knee. Slice width of 2 mm, τ=0.4 ms. Abbreviations are as follow: PT-patella tendon, CL-cruciate ligament. LC-lateral coligament.

Figure 15:
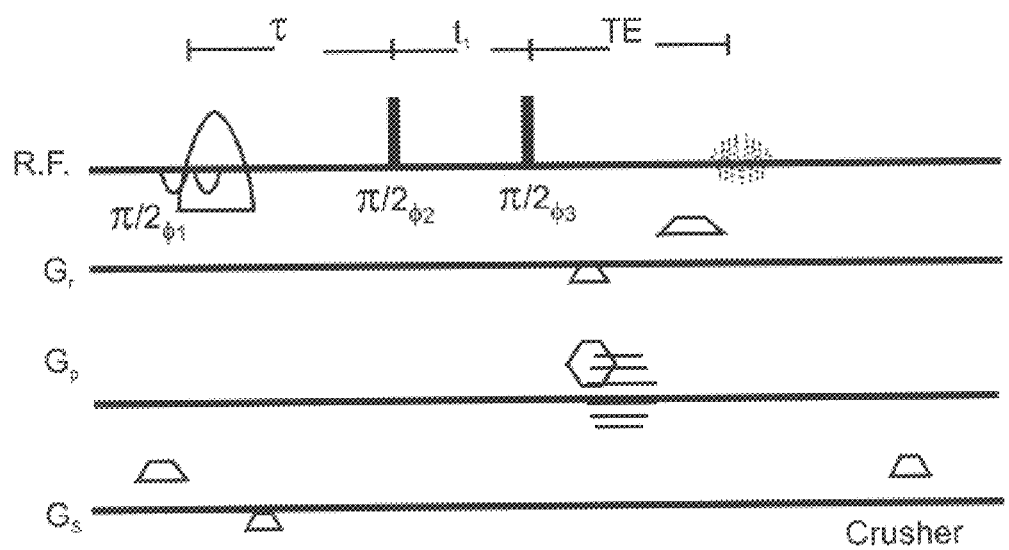

FIG. 15 demonstrates slice selective $^1$H DQF pulse sequence. Acquisition parameters are given in the Examples section below. The 16 step phase cycling is given by: $\phi_1=0°$ 90° 180° 270° 90° 180° 270° 0° 180° 270° 0° 90° 270° 0° 90° 180°; $\phi_2=0°$ 90° 180° 270°; $\phi_3=0°$; $\phi_{receiver}=0°$ 180° 0° 180° 90° 270° 90° 270° 180° 0° 180° 0° 270° 90° 270° 9°.

Figure 16:
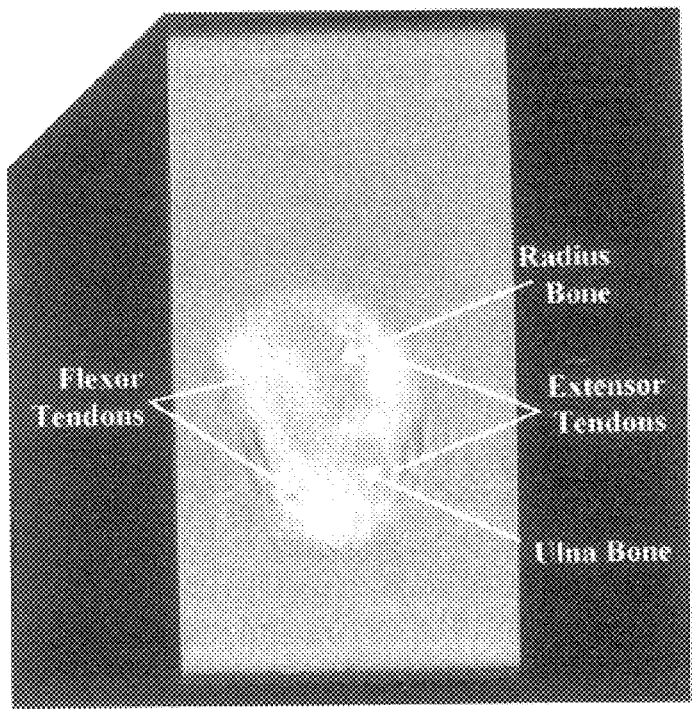

FIG. 16 shows axial view of the human wrist acquired with $^1$H DQF contrast in 17 minutes.

Figure 17:
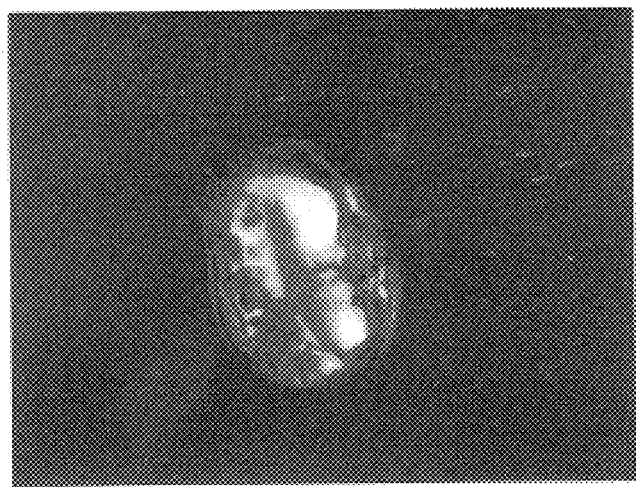

FIG. 17 shows Gradient Recalled Echo axial view of the human wrist acquired at the same level as the $^1$H DQF image shown in FIG. 16.

Figure 18:
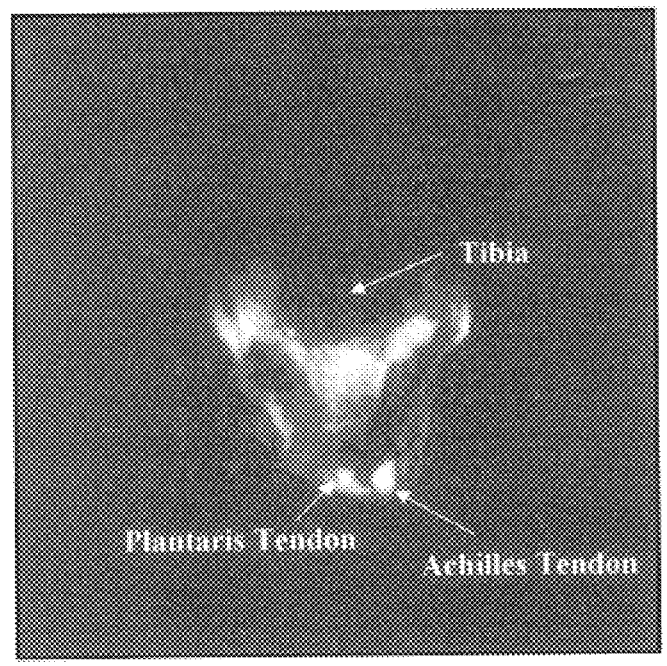

FIG 18 shows axial view of the Achilles tendon acquired with $^1$H DQF contrast. The total acquisition time was 17 minutes.

Figure 19:

FIG. 19 show axial view of the Achilles tendon acquired with $^1$H DQF contrast. Acquisition parameters are identical to those for the image depicted in FIG. 18 except for the total acquisition time of 8.5 minutes. Note that the signal suppression in the tibia bone marrow is slightly less efficient due to SQ leakage.

Figure 20:
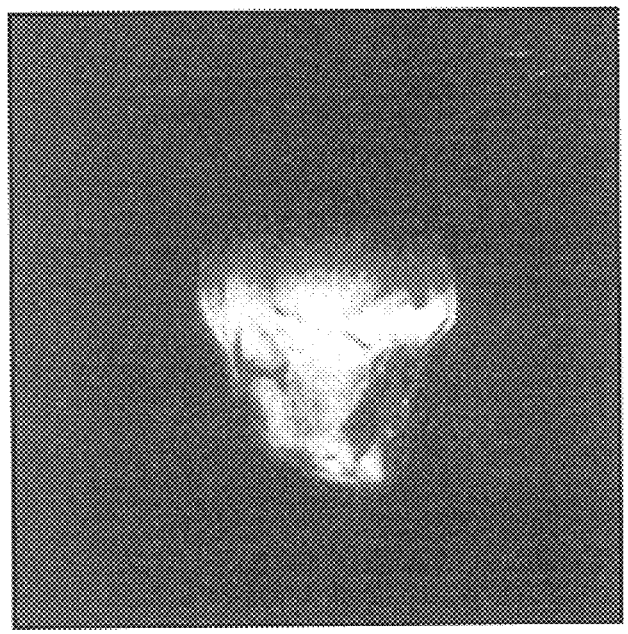

FIG. 20 shows axial view of the Achilles tendon acquired with $^1$H DQF contrast. Acquisition parameters are identical to those for the image depicted in FIG. 18 except for the total acquisition time of 3.4 minutes. SQ leakage is now dominating image contrast, which is severely compromised.

Figure 21:
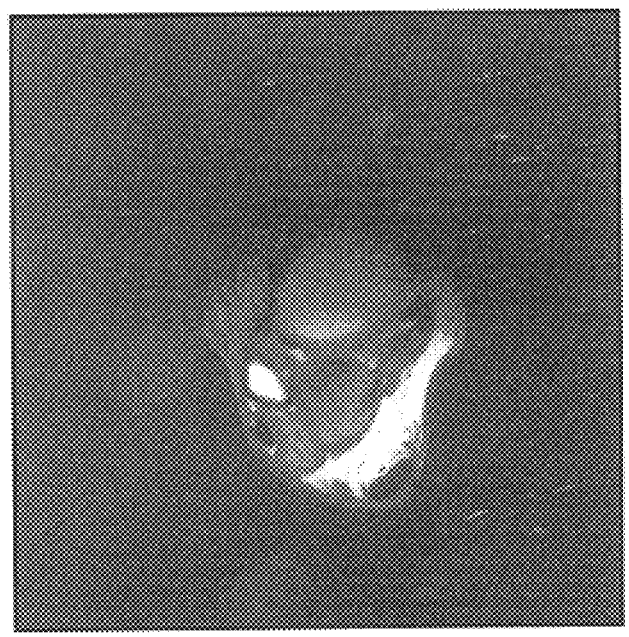

FIGS. 21 shows Gradient Recalled Echo axial view of the Achilles tendon acquired at the same level as the $^1$H DQF images shown in FIGS. 18, 19 and 20.

Figure 22A:
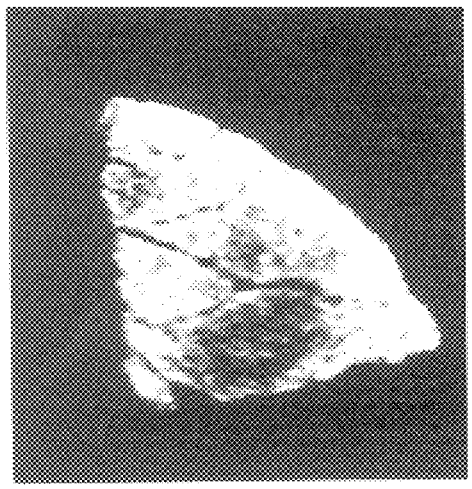
Figure 22B:
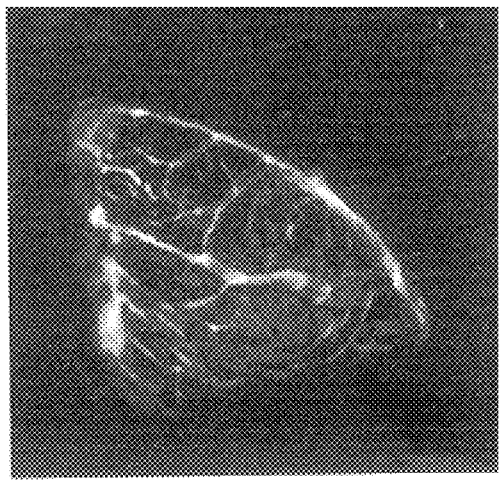

FIGS. 22a–b show axial gray level images of the isolated human Achilles tendon shown in FIGS. 22a–b. Image acquisition parameters are described in the text. FIGS. 22a—$^1$H DQF image; FIG. 22b Gradient Recalled Echo image.

Figure 23:
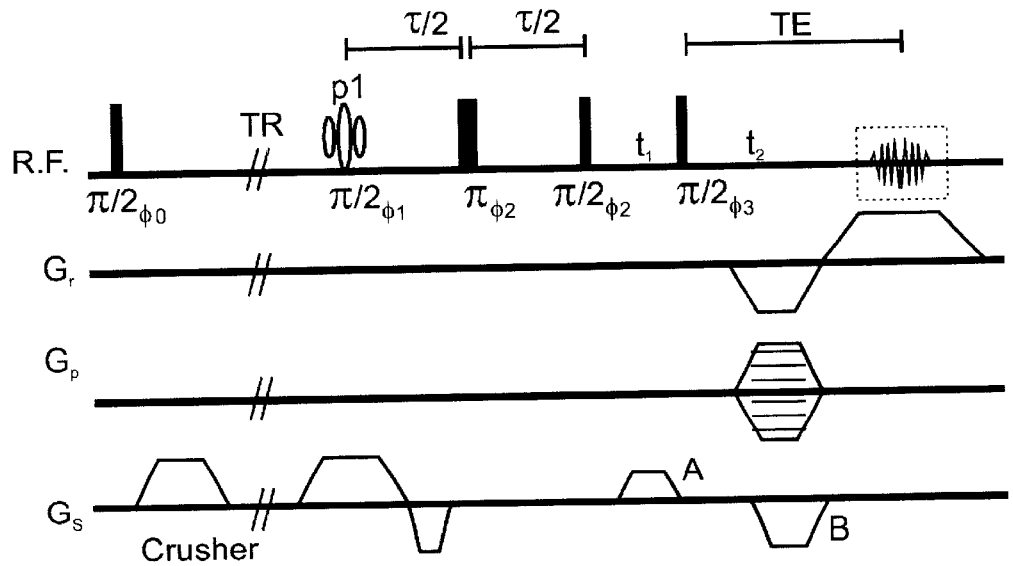

FIG. 23 shows slice selective $^1$H DQF pulse sequence using gradients for DQ selection. No phase cycling is required hence $\phi_0=\phi_1=\phi_2\phi_3=\phi_{receiver}=0°$ may be used. However for avoiding SQ leakage a minimal phase cycling is recommended $\phi_0=0°$; $\phi_1=0°$ 90° 180° 270°; $\phi_2=0°$ 90° 180° 270°; $\phi_3=0°$; $\phi_{receiver}=0°$ 180° 0° 180°.

Figure 24:
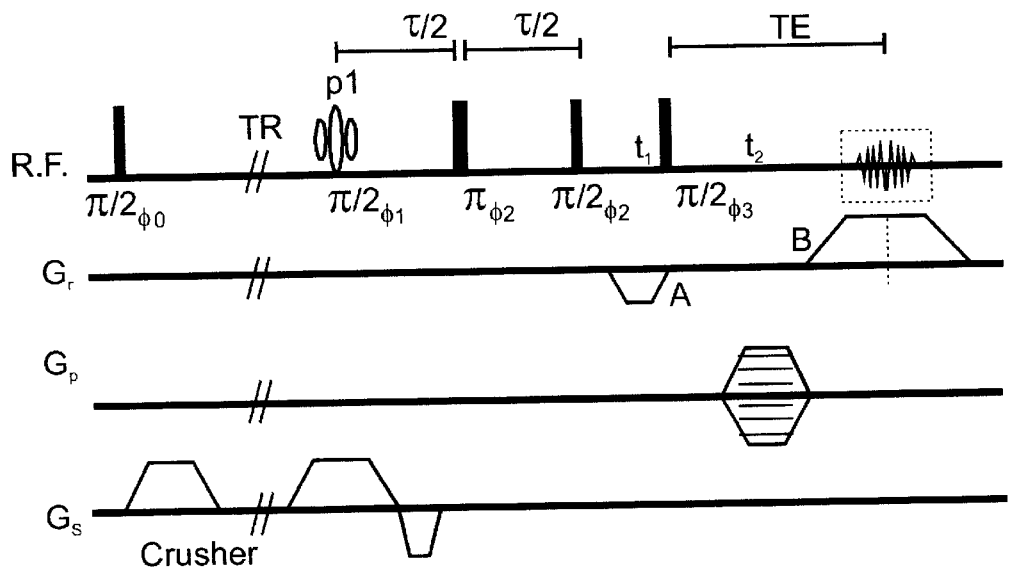

FIG. 24 shows slice selective $^1$H DQF pulse sequence using gradients for DQ selection. No phase cycling is required hence $\phi_0=\phi_1=\phi_2=\phi_3=\phi_{receiver}=0°$ may be used. However for avoiding SQ leakage a minimal phase cycling is recommended: $\phi_0=0°$; $\phi_1=0°$ 90° 180° 270°; $\phi_2=0°$ 90° 180° 270°; $\phi_3=0°$, $\phi_{receiver}=0°$ 180° 0° 180°.

DESCRIPTION OF THE PREFERRED EMBODIMENTS

The present invention is of a method of magnetic resonance imaging which can be used for obtaining slice selective multiple quantum images. Specifically, the present invention can be used to obtain magnetic resonance multiple quantum slice selected images of, for example, connective tissues and other ordered tissues, the slice images being characterized by unprecedented high contrast.

The principles and operation of the method according to the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

While reducing the present invention to practice, as is demonstrated and exemplified in the Examples section that follows, $^1$H double quantum filtered (DQF) imaging has been shown to highlight a variety of connective tissues and other soft tissues and hard tissues, including, but not limited to, tendons, ligaments, skin, subcotaneous tissue, muscle tissue and bone. $^1$H DQF imaging provides a new contrast, which is based on the non-zero average of the dipolar interaction due to anisotropic motion of water molecules, determined mainly by their interaction with the ordered collagen fibers. Tissues are characterized by the dependence of their DQF signal on the DQ creation time, τ. Using $^1$H DQF imaging, higher tissue contrast is obtained between, for example, tendon, cartilage, bone, skin and muscle, The tendons, which give weak signals in standard MRI techniques, are significantly highlighted in an appropriately created $^1$H DQF image, While implementing the present invention, $^1$H DQF imaging pulse sequence has been extended to include slice selection. The short transverse relaxation time of the $^1$H DQF imaging in connective tissues, presents a stringent demand on the application of gradients and radiofrequency pulse lengths needed for slice selection. According to the present invention, slice selection pulse sequence may be implemented by postponing the application of the slice refocusing gradient to the period after the last pulse just before the acquisition. $^1$H DQF imaging was applied, in accordance with the teachings of the present invention, to monitor a healing process of a dammaged tendon after tenotomy. The image changed dramatically during the healing process of the tendon. These changes matched the phases of the healing process. By using a τ-weighted contrast, the DQF images indicate the part of tendon which has not completely healed, even after the conventional MRI appeared normal. Further in accordance with the teachings of the present invention $^1$H DQF imaging was applied in-vivo to the human wrist and ankle wit a clinical 1.5 T MR scanner. Water molecules having anisotropic motion were detected from tendons and ligaments. Images of Achilles tendon were obtained for a voxel size of 1.25×1.25×20 mm with three values of TR=1.0, 0.5 and 0.2 s. resulting in total acquisitions time of 17, 8.5 and 3.4 minutes respectively. The in-vivo DQF images showed structure within the tendon that is otherwise not visible by conventional gradient recalled echo (GRE) methods.

Thus, according to the present invention there is provided a method of magnetic resonance imaging of an object. The method of the present invention is executed by implementing the following method steps, using, for example, a conventional magnetic resonance spectrometer, wherein in a first step, a radiofrequency pulse sequence selected so as to select a coherence of an order n is applied to the object, wherein n is zero. a positive or a negative integer other than ±1. In a second step of the method, magnetic gradient pulses are also lo applied to the object. These pulses are applied, for example, from at least three directions, optionally co-orthogonal directions. The radiofrequency pulse sequence and the magnetic gradient pulses time overlap and are programmed so as to select a slice of the object to be imaged. Finally, a radiofrequency signal resulting from the object is acquired, so as to generate a magnetic resonance slice image of the object. The slice image is then displayed on a display and can be used for analysis.

According to a presently preferred embodiment of the present invention the coherence is selected to be double quantum filter (DQF), where n equals =2. However, it will be appreciated that similar results can be obtained using a triple quantum filter (TQF), where n equals ±3. As is further exemplified in the Examples section that follows, the coherence (n) can be selected by either phase cycling or by gradient selection.

The radiofrequency itself is selected so as to enable imaging of a desired atomic nucleus. Suitable atomic nuclei include, for example. $^1$H, $^2$H and $^{23}$Na. Thus, the radiofrequency signal of the method of the present invention is preferably derived from an atomic nucleus selected from the group consisting of $^1$H, $^2$H and $^{23}$Na.

As is further detailed and exemplified in the Examples section that follows, while implementing the method of the present invention, several parameters are set so as to obtain optimal imaging results. Thus, for example, the radiofrequency pulse sequence is preferably selected so as to optimize imaging of the atomic nucleus of choice. In addition, a creation time of the radiofrequency pulse sequence is selected so as to maximize the radiofrequency signal of the selected nucleus, or to obtain a desired contrast within the imaged object. Furthermore, a time to echo, as is controlled by the magnetic gradient pulses, is selected, so as to maximize the radiofrequency signal derived from the selected nucleus, or to obtain a desired contrast within the imaged object. Still furthermore, a repetition Time of the radiofrequency pulse sequence is selected sufficiently long so as to minimize single quantum leakage.

In addition, applying a crusher pulse prior to applying the radiofrequency pulse sequence is preferably applied so as to permit shortening of the repetition time without increasing the single quantum leakage. The crusher pulse can be a magnetic gradient pulse, a radiofrequency pulse and a combination thereof. According to a presently preferred embodiment, the crusher pulse includes a first 90° radiofrequency pulse, followed by a gradient pulse, itself followed by a second 90° radiofrequency pulse.

It will be appreciated that while implementing the present invention, as id further exemplified in the Examples section that follows, a slice refocusing gradient, a read gradient or a phase gradient can be employed during a time interval, such as the creation time, the evolution time or the time to echo.

It will be appreciated that the nature of the object studied by the method of the present invention is of less importance, provided that the object includes the atomic nucleus of choice. However, the method of the present invention has been specifically calibrated so as to yield slice images of tissues, such as connective tissue. The scope of the present invention is not limited to providing slice images of connective tissues, as any tissue of sufficient order and for that matter any other object may be analyzed using the method of the present invention. An analyzed tissue according to the present invention can, for example, be a tendon, a portion of a skin, a bone, a muscle, a cartilage, a blood vessel, a ligament, an organ (e.g., a brain, a heat, a kidney, a gland, a testicle, an ovary, an eye, a liver, a pancreas or a spleen) or a portion thereof, a nerve or a lymph node.

The advantages of the present invention over prior art designs are self evident from the images provided herewith in the drawings. These images are characterized by high contrast which as so far have been unobtainable using prior art methods of magnetic resonance imaging.

Additional objects, advantages, and novel features of the present invention will become apparent to one ordinarily skilled in the art upon examination of the following examples, which are riot intended to be limiting. Additionally, each of the various embodiments and aspects of the present invention as delineated hereinabove and as claimed in the claims section below finds experimental support in the following examples.

EXAMPLES

Reference is now made to the following examples, which together with the above descriptions, illustrate the invention in a non limiting fashion.

Example 1

Background

The rupture of the Achilles tendon is a common incident in daily and sports activities. Rehabilitation lasts at least several months and, in some cases, more than a year. Unfortunately, there is a lack of an objective scale for the tendon's chronic phase of healing, since standard MRI techniques and ultrasonography give very little information [T. M. Haygood, Magnetic resonance imaging of the musculoskeletal system: 7, The Ankle. Clin. Orthop. 336, 318–336 (1997); P. T. Karjalainen, J. Ahovuo, H. K. Pihlajamaki, K. Soila, H. J. Aronen, Postoperative MR imaging and ultrasonography of surgically repaired Achilles tendon ruptures. Acta Radiol. 37, 639–646 (1996)]. Protocols of rehabilitation have been made from clinical scoring that consists of walking ability, heel raising, stiffness, pain, weakness, etc. [O. Amer, A. Lindholm, Subcutaneous rupture of the Achilles tendon: A study of 92 cases. Acta Chir. Scand. (Suppl.) 239, 1–51 (1959); S. A. Solveborn, A. Moberg, Immediate free ankle motion after surgical repair of acute Achilles tendon ruptures. Amer. J. Sports Med. 22, 607–610 (1994); P. T. Karjalainen, H. J. Aronen, H. K. Pihlajamaki, K. Soila, T. Paavonen, O. M. Bastman, Magnetic resonance imaging during healing of surgically repaired Achilles tendon ruptures. Amer. J. Sports Med. 25, 164–171 (1997)]

Conventional MRI techniques depict intact tendons with a negative contrast relative to the surrounding soft tissues [T. M. Haygood, Magnetic resonance imaging of the musculoskeletal system: 7. The Ankle. Clia. Orthop. 336, 318–336 (1997)]. This occurs because water molecules in the tendon interact with collagen fibers, and thus have short transverse relaxation time ($T_2$=0.5–1.5 ms) [H. J. C. Berendsen, Nuclear magnetic resonance study of collagen hydration. J. Chem. Phys. 36, 3297–3304 (1962); C. Migchelsen, H. J. C. Berendsen. Proton exchange and molecular orientation of water in hydrated collagen fibers. An NMR study of $H_2O$ and $D_2O$. J. Chem. Phys. 59, 296–305 (1973); G. D. Fullerton, I. L. Cameron, V. A. Ord, Orientation of tendons in the magnetic field and its effect on $T_2$ relaxation times. Radiol. 155, 433–435 (1985); S. Peto, P. Gillis, V. P. Henri, Structure and dynamics of water in tendon from NMR relaxation measurements, Biophys. J. 57, 71–84 (1990)]. The collagen fibers are well oriented along the longitudinal direction of the tendon, inducing anisotropy to the bound water molecules and those in fast exchange with them [R. M. Henkelman, G. J. Stanisz, J. K. Kim, M. J. Bronskill, Anisotropy of NMR properties of tissues. Magn. Reson. Med. 32, 592–601 (1994); H. Takaamiya, Y. Kusaka, Y. Seo, M. Noguchi, T. Morimoto, Y. Hirasawa, Proton NMR relaxation anisotropy as a parameter to quantify oriented structure of the tendon tissue, Trarsac. Orthop. Res. Soc. 23, 1017 (1998)].

The fact that the water $T_2$ relaxation in the Achilles tendon has marked orientational anisotropy indicates the presence of microscopically ordered structures [H. J. C. Berendsen, Nuclear magnetic resonance study of collagen hydration. J. Chem. Phys. 36, 3297–3304 (1962); C. Migchelsen, H. J. C. Berendsen, Proton exchange and molecular orientation of water in hydrated collagen fibers. An NMR study of $H_2O$ and $D_2O$. J. Chem. Phys. 59, 296–305 (1973); G. D. Fullerton, I. L. Cameron, V. A. Ord, Orientation of tendons in the magnetic field and its effect on $T_2$ relaxation times. Radiol. 155, 433–435 (1985); S. Peto, P. Gillis, V. P. Henri, Structure and dynamics of water in tendon from NMR relaxation measurements. Biophys. J. 57, 71–84 (1990)].

It has been recently demonstrated by the present inventors that $^1H$ double quantum filtered (DQF) spectroscopy [L. Tsoref, H. Shinar, G. Navon, Observation of a $^1H$ double-quantum filtered signal of water in biological tissues. Magn Resou. Med. 39, 11–17 (1998)] as well as DQF MR imaging [L,. Tsoref, H. Shinar, Y. Seo. U. Eliav, G. Navon, Proton double-quantum filtered MRI—A new method for imaging ordered tissues. Magn. Reson. Med. 40, 720–726 (1998)] is a sensitive method for depicting biological tissues associated with ordered structures.

Since dipolar interaction completely averages to zero in isotropic media, a DQF NMR signal is obtained only in the presence of an ordered structure. As a consequence $^1H$ DQF MRI enables the direct visualization of tendons with positive contrast. In a recent theoretical and experimental work by the present inventors [U, Eliav, G. Navon, A study of dipolar interaction and dynamic processes of water molecules in tendon by $^1H$ and $^2H$ homonuclear and heteronuclear multiple quantum filtered NMR spectroscopy. S. Magn. Reson. 137, 295–310 (1999)], it was shown that the lineshape and the amplitude of the $^1H$ DQF spectra are affected by the ratio of the residual proton-proton dipolar interaction and the proton exchange rate. When this ratio decreases, the observed splitting of the DQF spectrum decreases until it reaches complete coalescence and the DQF signal intensity declines. When this ratio increases, the reverse is also true.

Materials and Methods

The healing process of the ruptured Achilles tendons was observed using 12 male Japanese white rabbits (2.5 kg). Under anesthesia, the right tendon was sharply and transversely severed 1 cm above its calcaneal insertion point (tenotomy). The severed ends of the tendon were ca. 0.5 cm apart, and the skin incision was closed using continuous sutures. Neither cast nor dressing were applied to the animals which were allowed unrestricted cage activity. In order to follow the healing process, the rabbits were anesthetized by pentobarbital (50 mg/kg administered intraperitoneally), and a leg was dissected en bloc 3, 9, 13 and 18 weeks after tenotomy. The specimen was inserted in a 25 mm NMR tube with the longitudinal axis of the Achilles tendon aligned parallel to the static magnetic field. After the leg was imaged, the different tissues, the Achilles tendon, the skin with the subcutaneous tissue, the cortical bone and the skeletal muscle were separated. For the spectroscopic measurements, the different specimens were each inserted in a 10 mm NMR tube, preserving the relative orientation of the leg, with the longitudinal axis of the Achilles tendon aligned parallel to the static magnetic field. The outer space was filled with Fluorinert (FC-77, 3M). Six intact Achilles tendons were also measured as the control.

NMR measurements were conducted on a Bruker AMX-300wb NMR spectrometer equipped with a micro 2.5 imaging probe (maximum gradient strength 100 G/cm, gradient rise time 150 $\mu s$ and $^1H$ radio frequency coils of 25 mm for imaging and 10 mm for spectroscopy). Pulse sequences of the DQF spectroscopy and the DQF imaging are shown in FIG. 1, where $\tau$ is the creation time and $t_1$ is the double quantum evolution time. Slice selection was applied using the first 90° Gaussian selective pulse in the presence of a slice gradient. The phase and frequency encoding gradients as well as the refocusing slice gradient were applied after the third 90° pulse [L. Tsoref, H. Shinar, Y. Seo, U. Eliav, G. Navon, Proton double-quantum filtered MRI—A new method for imaging ordered tissues. Magn. Reson. Med. 40, 720–726 (1998)]. The 16 step of the standard phase cycling was used [G. Bodenhausen, H. Kogler and R. R. Ernst, Selection of coherence-transfer pathways in NMR pulse experiments. J. Magn. Reson. 58, 370–388 (1984)]. All the examinations were done at 25° C. Animal experiments in this Example were carried out under the rules and regulations of the Animal Care and Use committee, Kyoto Prefectural University of Medicine.

Results and Discussion
Tissue Characterizaton:

The intensities of the DQF signal as a function of the creation time τ of the different tissues that constitute the leg are shown in FIG. 2. The DQF signals reached their maximum intensities at creation times of $\tau_{max}$=0.4 and 0.6 ms for the Achilles tendon and the skin (including the subcutaneous tissue), respectively. At longer τ values, they decayed and reached 20% of their maximum intensities at τ=1.8 and 6.0 ms, respectively. The DQF spectrum of the cortical bone is composed of two components. A major one with $\tau_{max}$ of about 0.05 ms and a fast decay reaching 20% of its maximum intensity at 0.28 ms. The other, minor component had a $\tau_{max}$ of 0.5 ms. The skeletal tissue did not give any significant DQF signal larger than the noise level of the spectrum.

Analysis of $^1$H DQF signals as a function of τ [U. Eliav, G. Navon, A study of dipolar interaction and dynamic processes of water molecules in tendon is by $^1$H and $^2$H homronuclear and heteronuclear multiple quantum filtered NMR spectroscopy. J. Magn. Reson. 137, 295–310 (1999)] shows that two NMR parameters are important: (i) the residual dipolar interaction related to the degree of order; and (ii) the proton exchange rate. Both parameters affect the value of $\tau_{max}$ and the decay rate at longer τ values. The fitting of the spectroscopic results of the intact tendon and skin to the equations given in a previous work by the inventors of the present invention [U. Eliav, G. Navon, A study of dipolar interaction and dynamic processes of water molecules in tendon by $^1$H and $^2$H homonuclear and heteronuclear multiple quantum filtered NMR spectroscopy. J. Magn. Reson. 137, 295–310 (1999)] yielded dipolar splittings of 950 and 510 Hz and proton exchange rates of 3600 and 3400 s$^{-1}$, respectively. Since the proton exchange rates are almost the same in both tissues, the differences in the Σ dependencies of the DQF signals reflect differences of degree of order in the tissues. It should be noted that in the case of small residual dipolar interaction, the decay rate and the DQF signal intensity are much more sensitive to the dipolar interaction than to $\tau_{max}$ [U. Eliav, G. Navon, A study of dipolar interaction and dynamic processes of water molecules in tendon by $^1$H and $^2$H homonuclear and heteronuclear multiple quantum filtered NMR spectroscopy. J. Magn. Reson. 137, 295–310 (1999)]. Indeed, the DQF signal amplitude of the skin had a much longer decay time and lower amplitude, but had a slightly longer $\tau_{max}$ value relative to that of the tendon. The splitting caused by the $^1$H dipolar interaction depends on the order of water molecules interacting with the collagen fibers and the orientation of the fibers relative to the magnetic field. The collagen fibers of the Achilles tendon are all very well oriented along the longitudinal axis. But, the fibers of the skin have mesh-like structures. Those fibers that are not oriented along the magnetic field have a smaller splitting and thus contribute less to the DQF intensity [U. Eliav, G. Navon, A study of dipolar interaction and dynamic processes of water molecules in tendon by $^1$H and $^2$H homonuclear and heteronuclear multiple quantum filtered NMR spectroscopy. J. Magn. Reson. 137, 295–310 (1999)].

Studies with $^2$H DQF conducted by the inventors of the present invention indicated that the collagen fibers are the major factor in determining the order of the water molecules and hence the DQF signal intensity. It was shown that the $^2$H DQF signal of the blood vessel wall disappears upon depletion of their collagen fibers [Y. Sharf, T. Knubovets, D. Dayan, A. Hirshberg, S. Akselrod, and G. Navon, The source of NMR-detected notional anisotropy of water in blood vessel walls. Biophys. J. 73, 1198–1204 (1997)]. The order of water molecules induced by the collagen fibers depends on the degree of order of the fibers and the fraction of water molecules interacting with the fibers. Naturally, this fraction depends on the collagen content of the tissue. In the Achilles tendon and the skin, the collagen content is approximately 30% and 200% of the wet weight of the tissue, respectively [T. Yamakawa, Data Book of Biochemistry 1. Tokyo Kagaku Dojin, p. 1923 (1979)]. As a result, the fraction of bound water is smaller in the skin than the tendon. This, together with the fact that collagen fibers in the skin are in a mesh-like arrangement may account for the smaller residual dipolar interaction and hence weaker $^1$H DQF signal intensity relative to the tendon.

The skeletal muscle contains a very small amount of collagen fibers (ca. 1.2% of wet tissue) [T. Yamakawa Data Book of Biochemistry I. Tokyo Kagaku Dojin; p. 1923 (1979)]. As shown in the previous work on $^2$H DQF [Y. Seo, H. Takamiya, H. Ishikawa, T. Nakashima, Y. Sharf and G. Navon, NMR imaging of rigid biological tissues. In: Spatially Resolved Magnetic Resonance (edited by P. Bluemler, B. Bluemich, R. Botto, E. Fukushima) Wiley-VCH p. 445–457 (1998)], the gastrocnemius muscle presented a small splitting of the DQF signal (ca. 50 Hz) compared with the large splitting (2.5 kHz) for the Achilles tendon. This suggests that the muscle proteins (actin, myosin, tropomyosin) contribute very weakly to ordering water molecules. This accounts for the lack of the detection of a significant $^1$H DQF signal in the skeletal muscle.

In the cortical bone, the observed DQF signal had a major short decaying component and a minor slow decaying one. The major structure of the cortical bone consists of collagen fibers firmly embedded in hydroxyapatite. It is reasonable to assume that the fast decaying DQF signal originated from this structure. The minor slow decaying component may rise from vessels of the Haversian canals and also from the periosteum as a source of contamination. The $^1$H DQF data of the bone suggest the possibility of applying this DQF technique for the study of bones and bone fractures.

Figures 3A, 3B:
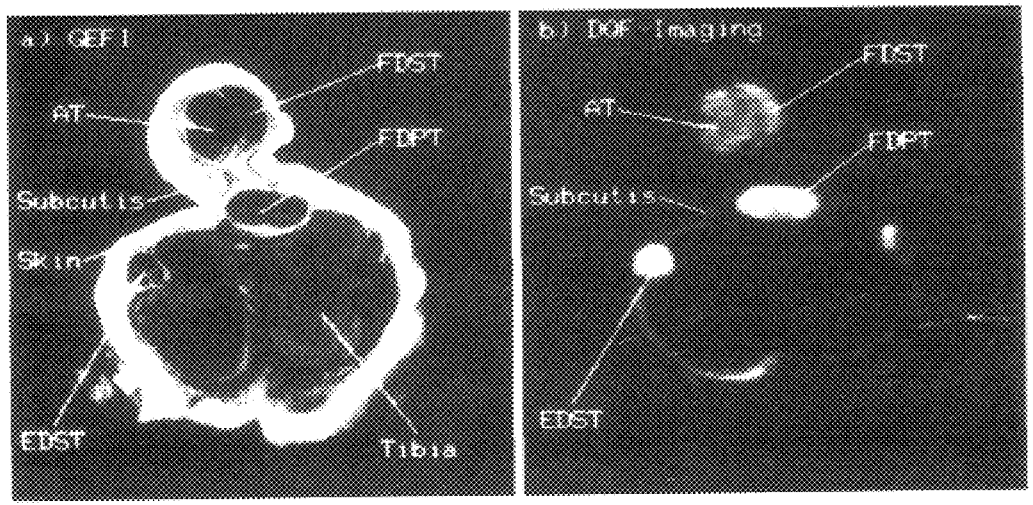

DQF MRI of Intact Leg:

Creation times of 0.4 ms (FIG. 3b) and 1 ms (not shown) were selected for the DQF imaging of the intact leg of a rabbit. As a control, an axial image was measured using the gradient-echo fast-imaging (GEFI) sequence (FIG. 3a). The Achilles tendon (AT) as well as the other tendons of the lower limb (flexor digitorum superficialis tendon—FDST, flexor digitorum profundus tendon—FDPT and extensor digitorum superficialis tendon—EDST) demonstrated a very low signal intensity in the GEFI image compared with the surrounding subcutaneous tissue and skin. In the DQF image, obtained at a creation time of 0.4 ms (FIG. 3b), the area of the Achilles tendon as well as the areas of the other tendons mentioned above (i.e., FDPT, FDST and EDST) was highlighted. A thin layer of the subcutaneous tissue was also depicted, and it is likely that collagen fibers in this layer are aligned along the longitudinal axis of the leg. Other tissues, including skin, muscle, cortical bone and bone marrow, were not detected in the $^1$H DQF image measured at τ of 0.4 ms. At a creation time of 1.0 ms, the signals of the tendons disappeared, and the skin and subcutaneous connective tissues were clearly depicted (data are not shown, but see FIGS. 5c and 6c). These results demonstrate that one can selectively image differently ordered tissues through DQF imaging by applying a "creation time contrast", DQF MRS and MRI of Raptured Achilles Tendon:

DQF spectra of the regenerated part of the Achilles tendons were measured as a function of the creation time, τ.

The results obtained at various stages of healing, as well as the results obtained for the intact tendons are summarized in FIG. 4. Three weeks after the tenotomy, the DQF signal was very weak. The value of $\tau_{max}$ prolonged to 1.6 ms and the decay of the intensity was very slow. At further stages of the healing process, the intensity of the $^1$H DQF signal increased, $\tau_{max}$ became shorter, and the decay became steeper.

In previous experiments, it was shown that the biexponential behavior of $T_2$ and the orientational anisotropy of its short component disappeared in the early stages following tenotomy [H. Takamiya, Y. Kusaka, Y. Seo, M. Noguchi, T. Morimoto, Y. Hirasawa, Proton NMR relaxation anisotropy as a measure to evaluate structural repair of injured tendon tissue. Transac. Orthop. Res. Soc. 24, 1078 (1999)]. The biexponential behavior of $T_2$ returned after 6 weeks, and the orientational anisotropy of $T_2$ returned after 12 weeks following the tenotomy. This behavior agrees with the results of the present study: The DQF signal became significant 6 weeks after the tenotomy and its decay became sharper at 13 weeks. Both the $T_2$ and the DQF results corresponded to the gradual regeneration of ordered structure in the recovering tendon. The physical activities of the rabbits recovered to almost the same level as the control about 20 weeks after the tenotomy. The creation time dependency of the DQF signal approached that of the control tendon, but the $\tau_{max}$ (0.7 ms) is longer and the decay is slower than that of the intact tendon.

Enwemeka [C. S. Enwemeka, Inflammation, cellularity, and fibrillogenesis in regenerating tendon: Implications for tendon rehabilitation. Phys. Ther. 69, 816–8 25 (1989)] divided the healing process of the ruptured Achilles tendon into 3 phases: inflammation, fibrillogenesis, and alignment and organization of the collagen fibrils. When the Achilles tendon is ruptured, tissue inflammation is dominant during the first week (inflammation phase). Before the end of the inflammation phase, the number of fibroblasts increases, collagen fibers are produced and matrix substances fill the gap caused by the rupture. The second stage, the "fibrillogenesis phase" takes about 3–6 weeks, In the middle of this phase, the size of the degenerated part of the tendon is enlarged and is highlighted in the conventional GEFI image (FIG. 5a). In the DQF imaging at a creation time of 0.4 ms (FIG. 5b), the uninjured tendons, the FDST and the FDPT, are clearly observed. On the other hand, the injured AT does not give rise to any DQF signal at this stage, This result corresponds with the spectroscopic result obtained 3 weeks after tenotomy, where the DQF signal is weak. Although the regenerated part of the tissue contains numerous collagen fibrils, they are not well aligned with the longitudinal axis of the tendon and the mean diameter of the collagen fibrils is smaller and more uniform (40±4.7 nm) compared with those of the intact tendon (161±57 nm) [T. Kitaura, Biomechanical and histological study of early active motion after primary repair of the raptured Achilles tendon. J. Kyoto Pref. Univ. Med. 107, 1223–1240 (1998)].

From 3 weeks after the tenotomy, there is a progressive alignment and organization of the collagen fibrils into bundles. The process may last several months. In this chronic phase of healing, conventional MR imaging and ultrasonography provide very little information [T. M. Haygood, Magnetic resonance imaging of the musculoskeletal system: 7. The Ankle. Clin. Orthop. 336, 318–336 (1997); P. T. Karjalainen, J. Ahovuo, H. K. Pihlajamaki, K. Soila, H. J. Aronen, Postoperative MR imaging and ultrasonography of surgically repaired Achilles tendon ruptures. Acta Radiol. 37, 639–646 (1996); P. T. Karjalainen, H. J. Aronen, H. K. Pihlajamaki, K. Soila, T. Paavonen, O. M. Bustman, Magnetic resonance imaging during healing of surgically 25, 164–171 (1997)].

Nine weeks after the tenotomy, the regenerated part of the tissue appeared to be almost the same as that of the intact Achilles tendon using the $T_2$-weighted GEFI image (data not shown). This is also true 18 weeks after the tenotomy (FIG. 6a). Compared with the intact Achilles tendon shown in FIG. 3a, the size of the regenerated Achilles tendon is almost the same, and it is depicted at a very low intensity. In the DQF image measured with a creation time of 0.4 ms (FIG. 6b), the regenerated Achilles tendon was highlighted nearly the same as other intact tendons, such as FDST and FDPT. However, at a creation time of 1 ms (FIG. 6c), the regenerated Achilles tendon was also highlighted, while the intact FDST and FDPT tendons were not. At an even longer creation time (2.0 ms), a part of the regenerated Achilles tendon gave a positive signal (FIG. 6d). It is interesting that this area corresponds with the area of low signal intensity in the DQF image at a creation time of 0.4 ms (marked with an asterisk). This area was confirmed to be a scar tissue by histological inspections performed after the NMR measurement. The scar tissue consists of regenerated collagen fibers, but the collagen fibers run randomly. The lower DQF signal intensity and the slower decay at the early stages of regeneration (see FIG. 4) indicates that the residual dipolar interaction is smaller. This results from the fact that the arrangement of fibers in the healing tendon has not reached that of the unaffected tendon structure. The result of the DQF image confirmed that the regenerated part of the tissue is not homogeneous at the macroscopic scale. This result emphasizes the advantage of using the DQF image over conventional $T_2$-weighted GEFI image, which cannot depict such differences, and over microscopic histology that cannot be applied to the whole tendon.

Thus, in this Example, it is shown that $^1$H DQF is a sensitive technique for imaging highly ordered tissues such as tendons and ligaments. It provides a new diagnostic tool for following the healing process of ruptured tendons. Gradient echo images give an impression of full recover a short period after tenotomy, whereas the $^1$H DQF images show that healing is only partial. Using the $^1$H DQF imaging, it was possible to identify the scar tissue a long time after the tenotomy. It is therefore evident that $^1$H DQF imaging is a very promising technique for examining the structural disorders in tendons in-vivo.

Example 2

Background

Connective tissues, such as ligaments, tendons and cartilage appear in standard magnetic resonance (MR) images with low signal-to-noise (S/N) ratio (SNR) due to the water short $T_2$ relaxation times. Images performed with short echo time (TE), result in a significant loss of contrast. In addition to the need to enhance the nuclear magnetic resonance (NMR) signal of connective tissues, it is also important to increase the contrast between the different compartments within a specific tissue and between adjacent tissues. Methods developed to meet these requirements include heavily $T^1$ weighted imaging [R. J. Scheck, A. Romagnolo, R. Hierner, T. Pfluger, K. Wilhelm, K. Hahn, The carpal ligaments in MR arthrography of the wrist: correlation with standard MRI and wrist arthroscopy, J. Magn. Reson. Imag. 1999; 9:468–474] magnetization transfer [T. D. Scholz, R. F. Hyot, J. R. DeLeonardis, T. L. Ceckler, R. S. Balaban, Water-macrornolecular proton magnetization transfer in infarcted myocardium: a method to enhance magnetic resonance image contrast, Magn. Reson. Med 1995; 33:178–184; M. L. Gray, D. Burstein, L. M. Lesperance, L. Gehrke, Magnetization transfer in cartilage and its constituent macromolecules, Magn. Reson. Med. 1995; 34; 319–325, R. M. Henkelman, X. Huang, Q.-S. Xiang, G. J. Staniz, S. D. Swanson, M. J. Bronskill, Quantitative interpretation of magnetization transfer, Magn. Reson. Med. 1993; 29:759–766], fat suppression [C. G. Peters, S. Majumdar, P. Lang, C. F. van Dijke, K. Sack, Hi. K. Ganant, MR Imaging of the arthritic knee: improved discrimination of cartilage, synovium, and effusion with pulsed saturation transfer and fat-suppressed $T_1$-weighted sequences, Radiology 1994; 191:413–419], diffusion weighted imaging [Y. Xia, T. Farquhar, N. Burton-Wurster, E. Ray, L. Jelinski, Diffusion and relaxation mapping of cartilage-bone plugs and excised disk using micromagnetic resonance imaging, Magn. Reson. Med. 1994; 31:273–2821] and projection reconstruction techniques that achieve much shorter echo time than conventional methods [G. E. Gold, J. M. Pauly, A. Macovsky, R. J. Herfkens, MR spectroscopic imaging of collagen: Tendons and knee menisci, Magn. Reson. Med. 1995; 34:647–654]. While these approaches do increase the MR signal of connective tissues and the contrast between connective and adjacent tissues, the results are not yet optimal for diagnostic purposes. It has recently been demonstrated by the inventors of the present invention that proton double quantum filtered (DQF) MRI produces a new type of contrast and may serve as a good modality for the imaging of ordered biological tissues [Y. Sharf, Y. Seo, U. Eliav, S. Akselrod, G. Navon, Mapping strain exerted on blood vessel walls using deuterium double quantum filtered MRI, PNAS 1998; 95;4108–4112; L. Tsoref, H. Shinar, G. Navon, Observation of a $^1H$ double quantum filtered signal of water in biological tissues, Magn. Reson. Med. 1998; 39:11–17; Tsoref, H. Shinar, Y. Seo, U. Eliav, G. Navon, Proton Double Quantum Filtered MR—A New Method for Imaging Ordered Tissues, Magn. Reson. Med. 1998; 40:720–7261]. The contrast in DQF MRI stems from the fact that only water molecules associated with ordered structures are detected and signals originating from molecules in isotropic tissues are suppressed. The $^1H$ DQF signal intensity is sensitive to the magnitude of the residual dipolar interaction and the proton exchange rate between the water molecules [U. Eliav, G. Navon, A study of dipolar interactions and dynamic processes of water molecules in tendon by $^1H$ and $^2H$ homonuclear and heteronuclear multiple-quantum-filtered NMR spectroscopy, J. Magn. Reson. 1999; 137:295–3101]. Previous studies of $^1H$ and $^{23}Na$ multiple quantum imaging [Tsoref, H. Shinar, Y. Seo, U. Eliav, G. Navon, Proton Double Quantum Filtered MRI—A New Method for Imaging Ordered Tissues, Magn. Reson. Med. 1998; 40:720–726; M. D. Cockman, L. W. Jelinski, Double-quantum-filtered sodium imaging, Y. Magn. Reson. 1990; 90:9–1] did not employ slice selection, and hence were limited to samples that are uniform along one axis. 3-D imaging techniques [R. Kemp-Harper, P. Styles, S. Wimperis, Three-dimensional triple-quantum filtration $^{23}Na$ NMR imaging, J. Magn. Reson B. 1995; 108:280–284] may to some extent solve this problem but are highly time consuming. Thus, for clinical applications a DQF slice selective sequence must be developed. The short relaxation times of tendons and ligaments poses a particular problem in a straightforward application of slice-selection to the previous DQF MRI pulse sequences [Tsoref, H. Shinar, Y. Seo, U. Eliav, G. Navon, Proton Double Quantum Filtered NM—A New Method for imaging Ordered Tissues, Magn. Reson. Med. 1998; 40:720–726].

Materials and Methods

For illustrating the slice selection and the contrast obtained by the DQF imaging method a phantom was prepared composed of a piece of bovine articular cartilage and a ligament. The tissues, obtained from bovine knee, were wiped dry, placed in a tube one on top of the other and immersed in Fluorinert (FC-77, obtained from 3M Co. Ltd.), which has low water solubility and magnetic susceptibility similar to that of water. Rat knees and lower legs, cut just above the ankle joint, were isolated from rats anesthetized with sodium pentobarbital. The samples were wiped dry and immersed in Fluorinert.

Imaging alas conducted on Bruker AMX360-WB spectrometer, using a BGU II micro-imaging, equipped with a 10 mm gradient probe, tuned to $^1H$. Measurements were performed at room temperature (22±2° C.).

In general DQ filtering is achieved by a series of three 90° pulses [A. Bax, R. Freeman, S. P. Kempsell, Natural abundance 13C—13C coupling observed via double quantum coherence, J. Am. Chem. Soc. 1980; 102:4849–4851]. As a result of the residual dipolar or quadrupolar interactions, second rank irreducible spherical tensor operators are created during the creation time, $\tau$. At the end of $\tau$, a 90° pulse is applied, which transforms the second rank single quantum coherence tensors into double quantum coherence tensors. The phase cycling ensures that only pathways that include DQ coherences are selected. Following the DQ evolution time $t_1$, a 90° pulse transforms the coherence back to −1 so it may be detected during acquisition. A 180° pulse in the middle of the $\tau$ period refocuses frequency shifts and magnetic field inhomogeneities.

In this Example, two slice selective pulse sequences are presented, that were developed for cases of short relaxation times (FIGS. 7 and 8). In the pulse sequence that we previously developed for $^2H$ DQF MRI [Y. Sharf, Y. Seo, U. Eliav. S. Akselrod, G. Navon, Mapping strain exerted on blood vessel walls using deuterium double quantum filtered MRI, PNAS 1998; 95:4108–4112] advantage was taken of the fact that the $^2H$ double quantum relaxation time, TDQ, is much longer than $T_2$. Gradients were applied during the DQ evolution time $t_1$, thus doubling their effect. Since TDQ for protons is shorter than $T_2$ (TDQ=0.6 ms as compared to $T_2$=1.2 ms for rat tail tendon) [L. Tsoref, H. Shinar, G. Navon, Observation of a $^1H$ double quantum filtered signal of water in biological tissues, Magn. Reson. Med. 1998; 39:11–17; Tsoref, H. Shinar, Y. Seo, U. Eliav, G. Navon, Proton Double Quantum Filtered MRI—A New Method for Imaging Ordered Tissues, Magn. Reson. Med. 1998; 40:720–726.), another strategy has to be taken. Hence, in the $^1H$ DQF imaging presented herein (FIGS. 7–8) the magnetic field gradients were employed during $t_2$, and the DQ evolution time, $t_1$, was kept as short as possible.

PS1 is the slice selective version of the DQF MRI presented in a previous work by the inventors of the present invention [Tsoref, H. Shinar, Y. Seo, U. Eliav, G. Navon, Proton Double Quantum Filtered MRI—A New Method for Imaging Ordered Tissues, Magn. Reson. Med. 1998; 40:720–7261]. In this pulse sequence the slice selection and the refocusing gradients are completed during $\tau$, hence it can be used for tissues with relaxation times that are not too short. For cases of very short $\tau$ values (in our case, $\tau$<1 ms) PS1 (FIG. 7) was modified in two ways: (FIG. 8) (a) The 180° pulse in the middle of the creation time was eliminated. (b) The refocusing gradient of the slice selection was applied during $t_2$. In this way the time between the two 90° pulses can be kept very short. Another advantage of applying the refocusing gradient during $t_2$ is the possibility to use a 4-step phase cycling instead of 16. This difference is due the fact that during τ both $T_{1,-1}$ and $T_{1,1}$ tensors are present. Therefore, two slices symmetric relative to the z=0 plane are selected. This "double slicing" is dealt with either by using a phase cycling of 16 steps, which chooses the particular pathway of 0→−1→±2→−1 as in PS1, or by placing the refocusing gradient in the $t_2$ interval, where the quad detection selects the tensor $T_{1,-1}$ and thus during τ only one tensor, $T_{1,-1}$, is selected. The latter protocol is being used in PS2. Due to their short relaxation times. PS2 was used for imaging of tendons and ligaments. For instance, for Achilles tendon the maximum intensity is obtained at $\tau_{max}$=0.46±0.05 ms [R. J. Scheck, A. Romagnolo, R. Hierner, T. Pfluger, K. Wilhelm, K. Hahn, The carpal ligaments in MR arthrography of the wrist: correlation with standard MRI and wrist arthroscopy, J. Magn. Reson, Imag. 1999; 9:468–474], For the observation of cartilage and the loose connective tissue that wraps the tendon PS1 can also be used. Its advantage for long τ values stems from minimizing signal losses due to motion and diffusion occurring between the slice selective and its refocusing gradients.

The longitudinal relaxation time of the bulk water molecules in the tissue is very long (1–2s). In order to avoid leakage of the single quantum (SQ) coherence, a long TR of about 5 s should be used. To shorten the experiment time, first a 90° pulse that transfers the magnetization along the z axis to the x-y plane was applied. This transverse magnetization is then destroyed by the crusher gradient. Thus, TR could be shortened by an order of magnitude. In any case the image is less sensitive to SQ leakage than the spectrum since in imaging the voxel intensity represents the integral of the spectrum and not its intensity. The isotropic SQ leakage is very narrow compared to the DQ signal, and although it may be prominent in the DQ spectrum, its integral is small and its contribution to the image is negligible.

Theoretical background

In recent theoretical and experimental studies conducted by the inventors of the present invention it was shown that $^1$H DQF spectra are affected by the residual proton-proton dipolar interaction, $\omega_{1_H-1_H}$, as well as the proton exchange rate, k, between water molecules [U. Eliav, G. Navon, A study of dipolar interactions and dynamic processes of water molecules in tendon by 1H and 2H homonuclear and heteronuclear multiple-quantum-filtered NMR spectroscopy, J. Magn. Reson. 1999; 137:295–310]. These two factors were found to affect the observed splitting, the linewidth and amplitidue of the DQF spectra. When the dipolar splitting, δ, is greater than the exchange rate, k, the effect of the latter is to scale down the observed splitting, while when the exchange rate prevails the splitting coalesces.

Assuming total transverse magnetization dephasing between cycles, one can write for the signal amplitude at the echo center, the following expressions [U. Eliav, G. Navon, A study of dipolar interactions and dynamic processes of water molecules in tendon by 1H and $^2$H homonuclear and heteronuclear multiple-quantum-filtered NMR spectroscopy, J. Magn. Reson. 1999; 137:295–310]:

In the case of slow proton exchange, k<δ (δ=3$\omega_{1_H-1_H}$), for PS1 (FIG. 7):

$$I \propto \frac{\delta^2}{2r^2}(1-e^{-TR/T_1})e^{-k\tau/2}\sin(r\tau)e^{-(\Delta\omega+k/2)TE}\sin(rTE) \quad [1]$$

and for fast proton exchange, k>δ, $$I \propto \frac{\delta^2}{2\rho^2}(1-e^{-TR/T_1})e^{-k\tau/2}\sinh(\rho\tau)e^{-(\Delta\omega+k/2)TE}\sinh(\rho TE), \quad [2]$$

where $$r = \frac{\sqrt{\delta^2-k^2}}{2} \quad \text{and} \quad \rho = \frac{\sqrt{k^2-\delta^2}}{2}.$$

Δω is the inhomogeneity of the magnetic field.
For PS2 similar expressions are obtained, with the addition of the Δω dependence during τ. Assuming that the carrier frequency is set on the water resonance:
For k<δ:

$$I \propto \frac{\delta^2}{2r^2}(1-e^{-TR/T_1})e^{-(\Delta\omega+k/2)\tau}\sin(r\tau)e^{-(\Delta\omega+k/2)TE}\sin(rTE), \quad [3]$$

and for k>δ:

$$I \propto \frac{\delta^2}{2\rho^2}(1-e^{-TR/T_1})e^{-(\Delta\omega+k/2)\tau}\sinh(\rho\tau)e^{-(\Delta\omega+k/2)TE}\sinh(\rho TE), \quad [4]$$

As can be seen from the above equations, a number of contrast mechanisms allow to differentiate between tissues with different residual dipolar splittings as well as relaxation rates. The maximum signal for each tissue is obtained at a different creation time, τ and thus the variation of τ is the main contrast mechanism in this technique. FIG. 9 illustrates the intensity of the DQF signal as a function of τ. The three curves correspond to three residual dipolar splitting values of 950, 400 and 120 Hz. The value of δ/2π=950 Hz was found to be the residual dipolar splitting of Achilles tendon [U. Eliav, G. Navon, A study of dipolar interactions and dynamic processes of water molecules in tendon by $^1$H and $^2$H homonuclear and heteronuclear multiple-quantum-filtered NMR spectroscopy, J. Magn. Reson. 1999; 137:295–310] and the values for articular cartilages fall in the range of 120–400 Hz. The exchange rate, k, was taken as 3500 s$^{-1}$ which is the value obtained for Achilles tendon at room temperature [U. Eliav, G. Navon, A study of dipolar interactions and dynamic processes of water molecules in tendon by $^1$H and $^2$H homonuclear and heteronuclear multiple-quantum-filtered NMR spectroscopy, J. Magn. Reson. 1999; 137:295–310]. A TE which gives maximum intensity was chosen for each curve, and the inhomogeneity of the magnetic field was neglected, In the case of δ/2π=950 Hz at room temperature δ>k and the curve oscillates as a function of τ. For the smaller values of δ, k>δ and the curves are composed of decaying exponentials without any oscillations FIG. 9 illustrates tat as δ increases, the maximal intensity is higher, occurs at shorter creation times and has a faster decay.

Additional contrast mechanism can be obtained by the variation of TE. In standard MRI the signal is maximal at the beginning of the acquisition and then decays with TE. Here, the signal is zero at TE=0 and then builds up to a maximum, which depends on the residual dipolar interaction and the proton exchange rate. Thus, a fine tuning of the contrast between tissues can be obtained by adjusting both τ and TE.

Results and Discussion

A sagital image of a phantom made of a piece of bovine ligament (Top) and articular cartilage (bottom) was obtained by gradient echo (GRE) and DQF MRI. The articular cartilage is composed mainly of hyaline cartilage. In order to observe the ligament the GRE image was taken using a short TE of 4.4 ms (FIG. 10a). At this short TE both tissues appear similar and they cannot be distinguished. $^1$H double quantum filtered images of the same phantom obtained with different periods of $\tau$ are shown in FIGS. 10b–10d. As can be seen, in the DQF images the two tissues are easily distinguished. In FIG. 10b, obtained with $\tau$=2 ms only the cartilage is observed, In FIG. 10c ($\tau$=1.2 ms) the intensity of the cartilage is decreased and the ligament appears with low intensity. In FIG. 10d ($\tau$=0.2 ms) only the ligament is observed. The DQ image of the ligament seems narrower than the GRE image since the loose connective tissue that wraps the ligament does not appear in the DQ image at $\tau$=0.2 ms. These images demonstrate that using different $\tau$ values one can enhance the image of the desirable tissue.

Two transverse slices of the phantom, obtained by GRE imaging (TR=200 ms, TB=7 ms) are shown in FIGS. 11a–b. One slice was set on the ligament (FIG. 11a) and the other on the cartilage (FIG. 11b). FIGS. 12a–c show images of the same slices obtained by slice selective $^1$H DQF imaging. Slices shown in FIGS. 12a and 12b were set on the ligament whereas the slice shown in FIG. 12c was set on the cartilage. In FIG. 12a the creation time was set to $\tau$=0.4 ms, which gives the maximal intensity for the ligament. When the creation time is longer ($\tau$=1.6 ms, FIG. 12b) only the loose connective tissue that wraps the ligament is observed. Indeed, this tissue appears in the GRE image with better signal to noise ratio (S/N) than the inner part of the ligament, due to longer $T_2$ relaxation times. The cartilage is clearly observed at $\tau$=1.6 ms in FIG. 12c.

$^1$H DQF imaging with slice selection was also applied to a rat lower leg, cut just above the ankle joint and to a rat knee. FIG. 13a shows a GRE transverse image of the rat leg, obtained with TR=100 ms and TE=7 ms. In this image the tendons and ligaments appear as black spots and cannot be distinguished from the bones. In the $^1$H slice selective DQF image (see FIG. 13b) of the same sample (slice thickness of 2 mm), the tendons and ligaments are highlighted and are clearly distinguished from the bones and the other tissues. $^1$H DQF imaging of a rat knee gave similar results FIGS. 14a–b).

To conclude, in this Example it is clearly demonstrated that $^1$H DQF imaging can be performed with slice selection also at very short creation times. These are necessary to create optimal contrast for imaging of tendons and ligaments. The ability to optimize the contrast so that either the image of the cartilage or the ligament is highlighted id further demonstrated. The qualities of the $^1$H DQF imaging give the method a significant advantage for imaging of connective tissues, and that the $^1$H DQF imaging technique will contribute to clinical imaging as well as to basic research. Indeed, as is Exemplified in Example 1 above, $^1$H DQF MRI was applied for monitoring the healing process of a ruptured rabbit Achilles tendon, exhibiting sensitivity to the different stages of the healing.

Example 3

Background

Ankle injuries are among the most common pathologies encountered in radiologic practice. These include not only injured bones and ligaments but also traumatized tendons. Magnetic resonance imaging is becoming the modality of choice for imaging joints due to its superior tissue contrast and multiplanar capabilities [R. H. Daffnier, Ankle trauma, Radiologic Clinics of North America 28, 395–421 (1990), J. C. Tsai, M. B. Zlatkin, Magnetic resonance imaging of the shoulder, Radiologic Clinics of North America 28, 279–291 (1990); Turek's Orthopedics principles and their application, Edited by S. L. Weinstein, J. A. Buckwalter, Fifth Ed., J. B, Lippincott Company, Philadelphia, p. 78–101 (1994)]. However, the full potential of MRI has not yet been reached. Its main disadvantage in the diagnosis of tendon and ligament injuries is the short $T_2$ relaxation constants of ordered tissues. When conventional MR imaging methods are used, the low signal to noise ratio (SNR) encountered in such tissues prohibits accurate visualization. To regain SNR with gradient recalled echo (GRE) methods, the echo time (TE) is usually shortened, resulting in a significant loss of contrast.

Tendons and ligaments are composed of densely packed and well oriented bundles of collagen fibers. Each fiber is in turn composed of thinner fibrils [C. A. Carlstedt, Mechnical and chemical factors in tendon healing, Acta Ortopaedica Scandinavia, supp. 224, vol. 58, (1987)]. The water molecules, which are bound along the collagen fibers [H. J. C. Berendsen, Nuclear magnetic resonance study of Collagen Hydration, J. Chem. Phys. 36, 3297–3304 (1962); S. Peto, P. Gillis and V. P. Henri, Structure and Dynamics of Water in Tendon from NMR Relaxation Measurements, Biophys. J. 57, 71–84 (1990)], exhibit anisotropic motion. The inventors of the present invention have previously demonstrated that multiple quantum techniques may be used as probes of order in biological tissues. Following their work of $^2$H DQF NMR and MRI [Y. Sharf, U. Eliav, H. Shinar and G. Navon, Detection of Anisotropy in Cartilage Using $^2$H Double Quantum Filtered NMR Spectroscopy, *J Magn. Reson. B* 107, 60–67 (1995); Y. Sharf, Y. Seo, U. Eliav, S. Akselrod, G. Navon, Mapping strain exerted on blood vessel walls using deuterium double quantum filtered MRI, PNAS 1998; 95:4108–4112], they have recently shown that proton double quantum filtered (DQF) MRI produces a new type of contrast and may serve as the means for imaging ordered biological tissues [L. Tsoref, H. Shinar, G. Navon, Observation of a $^1$H double quantum filtered signal of water in biological tissues, Magn. Reson. Med. 1998; 39:11–17; L. Tsoref H. Shinar, Y. Seo, U. Eliav, G. Navon, Proton Double Quantum Filtered MRI—A New Method for Imaging Ordered Tissues, Magn. Reson. Med. 1998; 40:720–726]. The contrast in DQF MRI stems from the fact that only water molecules associated with ordered structures are detected, and signal originating from molecules in isotropic tissues is suppressed. The $^1$H DQF signal intensity is sensitive to the magnitude of the residual dipolar interaction and the proton exchange rate between the water molecules [U. Eliav, G. Navon, A study of dipolar interactions and dynamic processes of water molecules in tendon by $^1$H and $^2$H homonuclear and heteronuclear multiple-quantum-filtered NMR spectroscopy, *J. Magn. Reson.* 1999; 137:295–310].

In this Example, the in-vivo use of the $^1$H DQF MRI is demonstrated. In particular this method is applied in imagine the human wrist and ankle. It is shows that although $^1$H DQF imaging requires high gradient slew-rates, by using composite RF-pulses one can apply $^1$H multiple quantum techniques with a commercial clinical spectrometer. The quality of the DQF images was evaluated by comparing their SNR and the contrast to noise ratio (CNR) to standard gradient-recalled-echo (GRE) images.

Materials and Methods

In-vivo experiments were performed on a General Electric Signa LX-CVMR 1.5 T spectrometer. The gradient coil assembly was capable of 40 mT/m at slew rates of 150 T/m/s. A modified saddle coil was used for both RF transmission and signal detection. The coil was shaped to encompass the humans Achilles tendon or the human wrist as required. Spin excitation was achieved with a maximum power of 1.85 kWatts. The pulse sequence utilized in the present Example is described in FIG. 15. A three-lobe 90-degree sinc pulse (168 ms) was utilized for the slice excitation. The two 90-degree non-selective RE pulses bracketing the evolution period $t_1$ were 60 ms in duration each. All three RF pulses were combined in a single composite pulse. This was found to be necessary for the given hardware in order to minimize the dead time used for setting up the frequency synthesizer and unblanking the RF amplifier before each RF pulse. This dead time is about 350 ms and is intrinsic to this clinical system. Such delays can severely attenuate the DQF signal during the evolution period $t_1$. A single composite pulse that contains all three RF pulses solves this problem by setting up the RF hardware only once per acquired k-space line. The phase of the receiver and each of the three components of the composite pulse was set according to the phase cycling scheme shown in FIG. 15.

A detailed explanation of the pulse sequence used for these experiments is presented under Example 2 above. In short, as a result of the residual dipolar or quadrupolar interactions, second rank irreducible spherical tensor operators are created during the creation time, τ. At the end of τ, a 90° pulse is applied, which transforms the second rank single quantum coherence tensors into double quantum coherence tensors. The phase cycling ensures that only DQ coherences are selected. Following the DQ evolution time $t_1$, a 90° pulse transforms the coherence back to -1 so it may be detected during acquisition.

In the $^1$H DQF technique the main contrast mechanisms is the creation time τ. The maximum signal for each tissue is obtained at a different creation time, $\tau_{max}$, ($\tau_{max}$=400 ms for tendons [L. Tsoref, H. Shinar, G. Navon, Observation of a $^1$H double quantum filtered signal of water in biological tissues. Magn. Reson. Med. 1998; 39:11–17]. Since the DQ filtered signal has a maximum as a function of the echo-time, TE is adjusted to be as close as possible to $\tau_{max}$. For this reason, fractional echo sampling combined with conjugate k-space synthesis was utilized. From the 128 points per echo, only 80 were sampled at 125 kHz while the remaining 48 were software-reconstructed. As such, the elapsed time from the center of the slice-selective RF pulse to the center of k-space data acquisition was $t_1$+τ+TE=1.5 msec. The interval length between the two non-selective RF pulses was kept minimal (2 ms), resulting in $t_1$=62 ms. The elapsed time from the center of the second non-selective RF pulse to the center of the echo was TE=746 ms. The value of the creation time τ was 702 ms. Shorter τ value that would further increase the signal from the tendons could be obtained by applying the refocusing part of the slice selective gradient during TE rather than during the creation time τ.

The 128×64 data matrix with a rectangular field of view of 16×8 cm yielded a pixel size of 1.25×1.25 mm. The slice thickness was 2 cm. At a repetition time (TR) of 1 sec and 16 excitations, one slice was acquired every 17 minutes. Images with shorter TRs of 500 and 200 msec were also acquired in 8.5 and 3.4 minutes, respectively.

The same slices were also imaged with a conventional gradient recalled echo pulse sequence. These served as anatomical reference images. Acquisition parameters were as follows: TE 3 ms, TR 50 ms, BW 125 kHz, 256×256 matrix, fov 16×8 cm, slice thickness 2 cm, flip angle 30°.

Microscopic imaging experiments on the isolated human Achilles tendon were performed with a Bruker AMX360-WB spectrometer, using the BGU II micro-imaging accessories. The assembly utilized was the Micro 5.0 10 mm $^1$H imaging probe. The isolated tissue was imaged both with $^1$H DQF and GRE techniques. Axial DQF images were acquired with τ=0.4 ms, TR=1 s, TE=0.84 ms, FOV of 1×1 cm, data matrix size of 128×128, slice thickness of 2 mm. Gradient Recalled Echo micro-imaging was performed with TR=0.5 s, TE=7 ms, FOV of 1×1 cm, data matrix size of 256×256, slice thickness of 2 mm.

Results and Discussion

An axial double quantum filtered image of a human wrist is shown in FIG. 16. The total acquisition time was 17 minutes. The corresponding anatomical image, obtained with a conventional GRE sequence, is presented in FIG. 17. Signals originating from tissues that are not ordered, such as the bone marrow, are suppressed in the DQF image. On the other hand, flexor and extensor tendons, which appear as black areas in the GRE image, are highlighted in the DQF; image.

Axial DQF images acquired from a human ankle are presented in FIGS. 18–20. These correspond to repetition periods of TR=1000, 500 and 200 msec, respectively. The corresponding acquisition times are 17, 8.5 and 3.4 minutes, respectively. Contrast degradation is observed for shorter TR values (FIGS. 19, 20) and is particularly significant for the shortest TR (200 ms) as seen in FIG. 20. It is speculated that the reason for this observation is an increased leakage of single quantum (SQ) signal at the shorter TR values, Efficient crushing of both longitudinal and transverse magnetization at the end of each TR period should be considered when faster data acquisition is required. It is interesting to note that contrast is lost initially at locations where $B_1$ inhomogeneity is prevalent such as the tibia bone marrow. This is in line with possible leakage of single quantum signal, which is enhanced relative to the DQF signal, when the pulses deviate from the optimal value of 90°. The Achilles and plantaris tendons were positioned at the center of the homogeneous region of the saddle coil and as such, the spins experienced 90-degree notations for all three RF pulses. However, their signal diminished for the short TR experiment due to incomplete recovery of the longitudinal magnetization. The corresponding anatomical image is shown in FIG. 21. Acquisition parameters are identical to the ones used for the wrist. It should be noted that although the resolution of this image is superior to that of the DQF image, the tendons and ligaments appear black in the GRE images and thus lack any information. It is interesting to note that the DQF image of the Achilles tendon is not homogeneous but shows internal structure within the tendon. Comparison of the DQF image with that obtained with GRE shows that of the black area in the GRE (FIG. 21) which represents the Achilles tendon, only the left hand part is very bright in the DQF image (FIG. 18), whereas the right hand side is relatively darker. FIGS. 22a–b show higher resolution DQF and GRE images obtained from the isolated human Achilles tendon that were acquired with a high resolution spectrometer. As expected, in the DQF image the ordered fiber bundles are depicted, while the loose connective tissue surrounding the bundles is highlighted hi the GRE image.

Signal to noise ratio measurements were obtained from the Achilles tendon in the in-vivo DQF images. Since magnitude images were utilized for this purpose, SNR was defined as the average value of the tissue of interest over the average value of the thermal noise. These average values are summarized in Table 1 along with the standard deviations.

TABLE 1

Average signal measured from tissues in the DQF images with different TRs

|  | Achilles Tendon | Bone Marrow | Thermal Noise |
| --- | --- | --- | --- |
| TR = 1000 ms | 158, SD = 14.8 | 12.5, SD = 4 | 4.8, SD = 1.9 |
| TR = 500 ms | 141, SD = 14 | 33.1, SD = 4 | 4.5, SD = 2.6 |
| TR = 200 ms | 84.3, SD = 8.2 | 85.4, SD = 8.1 | 4.2, SD = 2.3 |

Therefore, the SNR measured in the Achilles tendon for the shortest TR is (200 ms) degrades by approximately 63% when compared to the other two longer acquisitions. Moreover, it is interesting to note that the contrast between ,he Achilles tendon and the bone marrow degrades from more than 10:1 for tie slow acquisition down to 1:1 for a TR of 200 ms.

The present Example represents the first in-vivo application of $^1$H DQF MRI in humans with a clinical scanner. It is shown that tendons and ligaments, that are not visible with the standard GRE sequence, are clearly shown in the DQF image. Moreover, the internal structure of the tendon can also be observed. This Example already points to several issues that need to be addressed with DQF imaging in humans. The quality of the results obtained with this technique is highly dependent on $B_1$ homogeneity. Deviations from 90° notations have detrimental effect on the DQF signal intensities and therefore increase the relative contribution from SQ signals that leak into the acquisition window. Therefore, contrast is compromised. Thus, RF coil design with respect to $B_1$ homogeneity becomes an important factor for DQF implementation. Since very short RF, pulses are desirable in order to avoid double quantum signal attenuation, the use of the scanner's body RF coil is not an option. Speeding up the data acquisition with DQF sequences will not only depend on RF coil characteristics but also on the ability to adequately dephase the magnetization along all three axes at the end of each TR period.

Comparison of contrast to noise values would be misleading, since in standard Gradient Recalled Echo MRI no intensity is observed for the Achilles tendon, and therefore it would appear having very good contrast relative to the surrounding tissues. However, this lack of signal implies that no information about the structure and possible abnormalities of this tissue can be obtained. The high resolution MR images obtained from an isolated human Achilles tendon indicate that internal structure can be seen also in the GRE image. However, the contrasts obtained by the two methods are completely different from each other. Therefore it is expected that the two methods will show different sensitivities to various pathologies. For instance, in Example 1 above, it is demonstrated that the $^1$H DQF MRI is a sensitive method for monitoring the healing process of a ruptured rabbit Achilles tendon. With conventional MRI techniques, the signal arising from the tendon disappeared completely while the healing process was not completed. The later stages of the healing could be observed only by $^1$H DQF MRI. In view of the present results, monitoring the healing process of injures tendons and ligaments in human subjects now becomes feasible.

In the previously described pulse sequences (e.g., FIGS. 1, 7, 8 and 15), the double quantum coherence was selected using phase cycling. The coherence can also be selected using gradients. This is performed by adding gradients to the former pulse sequences (FIG. 7) as shown in FIG. 23.

In order to select the DQ coherence, the areas under the gradients that are marked as A and B, must full the condition: area(B)=−2·area(A). In generals for a selection of coherence m the condition area(B)=−m·area(A) must be fulfilled. (Using gradients for coherence selection shortens the aquizition time since no phase cycling is required. However, in order to reduce SQ leakage, a minimal phase cycle of 4 steps is recommended, as indicated in FIG. 23. Due to the symmetry of the spin dynamics during $\tau$ period and $t^2$ periods gradient B may also be applied during $\tau$.

Another option of coherence selection by gradients is shown in FIG. 24, In this case the negative part of the readgradient is employed during $t_1$ and is marked as A. The positive part of the read gradient is marked as B. For DQ selection, the area under B taken until the time of the maximum of the echo, should equal twice the area under A with a negative sign.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A method of magnetic resonance imaging of an object, the method comprising:

(a) applying a radiofrequency pulse sequence selected so as to select a coherence of an order n to the object, wherein n is zero, a positive or a negative integer other than ±1;

(b) applying magnetic gradient pulses to the object, so as to select a single slice of said object to be imaged and create an image; and (c) acquiring a radiofrequency signal resulting from the object, so as to generate a magnetic resonance slice image of the object.

2. The method of claim 1, wherein said coherence is selected from the group consisting of double quantum filler (DQF), where n equals ±2 and triple quantum filter (TQF), where n equals ±3.

3. The method of claim 1, wherein said coherence is selected by phase cycling or gradient selection.

4. The method of claim 1, wherein said radiofrequency is selected so as to enable imaging of an atomic nucleus selected from the group consisting of $^1$H, $^2$H and $^{23}$Na.

5. The method of claim 4, wherein said radiofrequency pulse sequence is selected so as to optimize imaging of said atomic nucleus.

6. The method of claim 1, wherein said radiofrequency signal is derived from an atomic nucleus selected from the group consisting of $^1$H, $^2$H and $^{23}$Na.

7. The method of claim 1, wherein a creation time of said radiofrequency pulse sequence is selected so as to maximize said radiofrequency signal or to obtain a desired contrast.

8. The method of claim 1, wherein a time to echo as controlled by said magnetic gradient pulses is selected so as to maximize said radiofrequency signal or to obtain a desired contrast.

9. The method of claim 1, wherein a repetition time of said radiofrequency pulse sequence is selected sufficiently long so as to minimize single quantum leakage.

10. The method of claim 9, further comprising the step of:
(d) applying a crusher pulse prior to step (a) so as to permit shortening of said repetition time.

11. The method of claim 10, wherein said crusher pulse is selected from the group consisting of a magnetic gradient pulse, a radiofrequency pulse and a combination thereof.

12. The method of claim 10, wherein said crusher pulse includes a first 90° radiofrequency pulse, followed by a gradient pulse and a second 90° radiofrequency pulse.

13. The method to claim 1, wherein a slice refocusing gradient is employed during a time interval selected from the group consisting of a creation time, an evolution time and a time to echo.

14. The method of claim 1, wherein a read gradient is employed during a time interval selected from the group consisting of a creation time, an evolution time and a time to echo.

15. The method of claim 1, wherein a phase gradient is employed during a time integral selected from the group consisting of a creation time, an evolution time and a time to echo.

16. The method of claim 1, wherein said object is a tissue.

17. The method of claim 16, wherein said tissue is a connective tissue.

18. The method of claim 16, wherein said tissue is selected from the group consisting of a tendon, a portion of a skin, a bone, a muscle, a cartilage, a blood vessel, a ligament, an organ or a portion thereof, a nerve, a lymph node.

19. The method of claim 18, wherein said organ is selected from the group consisting of a brain, a heart, a kidney, a gland, a testicle, an ovary, an eye, a liver, a pancreas and a spleen.

20. The method of claim 1, wherein a single coherence pathway is selected during said applying of said magnetic gradient pulses.

* * * * *

UNITED STATES PATENT AND TRADEMARK OFFICE
CERTIFICATE OF CORRECTION

PATENT NO. : 6,373,250 B1
DATED : April 16, 2002
INVENTOR(S) : Tsoref et al.

It is certified that error appears in the above-identified patent and that said Letters Patent is hereby corrected as shown below:

Column 24,
Line 51, delete "filler" and substitute -- filter -- therefor.

Signed and Sealed this

Twentieth Day of August, 2002

Attest:

Attesting Officer

JAMES E. ROGAN
Director of the United States Patent and Trademark Office